United States Patent
Ueda et al.

(10) Patent No.: US 7,612,397 B2
(45) Date of Patent: Nov. 3, 2009

(54) MEMORY CELL HAVING FIRST AND SECOND CAPACITORS WITH ELECTRODES ACTING AS CONTROL GATES FOR NONVOLATILE MEMORY TRANSISTORS

(75) Inventors: Naoki Ueda, Nara (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 35 days.

(21) Appl. No.: 11/938,568

(22) Filed: Nov. 12, 2007

(65) Prior Publication Data

US 2008/0130366 A1 Jun. 5, 2008

(30) Foreign Application Priority Data

Nov. 10, 2006 (JP) ............................. 2006-305230
Mar. 26, 2007 (JP) ............................. 2007-080280

(51) Int. Cl.
*H01L 27/108* (2006.01)
*H01L 29/76* (2006.01)
*H01L 29/94* (2006.01)
*H01L 31/119* (2006.01)
*H01L 29/00* (2006.01)

(52) U.S. Cl. ..................... 257/296; 257/297; 257/298; 257/299; 257/300; 257/532; 257/E27.016; 257/E27.017; 257/E27.071; 257/E27.093

(58) Field of Classification Search ......... 257/296–300, 257/532, E27.016, E27.017, E27.071, E27.093
See application file for complete search history.

(56) References Cited

U.S. PATENT DOCUMENTS 4,985,718 A * 1/1991 Ishijima ..................... 257/306

5,120,996 A * 6/1992 Mead et al. ................. 327/94
5,301,150 A * 4/1994 Sullivan et al. ........ 365/185.08

(Continued)

FOREIGN PATENT DOCUMENTS

JP 6-334190 12/1994

(Continued)

OTHER PUBLICATIONS

Boaz Eitan et al. (1999) "Can NROM, a 2 Bit, Trapping Storage NVM Cell, Give a Real Challenge to Floating Gate Cells?," *Extended Abstracts of the 1999 International Conference on Solid State Devices and Materials*, Tokyo: 522-523.

*Primary Examiner*—Ida M Soward
(74) *Attorney, Agent, or Firm*—Morrison & Foerster LLP

(57) ABSTRACT

A nonvolatile memory cell that can be mounted in a CMOS manufacturing process, and is capable of implementing high level of programming, reading and erasing ability. The memory cell is configured by a MOS transistor including two N-type first impurity diffusion layers formed separately on a P-type semiconductor substrate, and a first gate electrode formed above a first cannel region sandwiched by both diffusion layers through a first gate insulation film, a first capacitor comprising P-type second impurity diffusion layers formed on a well, and a second gate electrode formed above the diffusion layer through a second gate insulation film, and a second capacitor comprising the well adjacent to the second impurity diffusion layer, and a third gate electrode formed above the well through a third gate insulation film, wherein a different voltage can be applied to each of the capacitors.

17 Claims, 13 Drawing Sheets

U.S. PATENT DOCUMENTS

| | | | |
|---|---|---|---|
| 5,465,231 A | 11/1995 | Ohsaki | |
| 5,888,854 A * | 3/1999 | Morihara | 438/155 |
| 5,932,916 A * | 8/1999 | Jung | 257/355 |
| 6,222,764 B1 | 4/2001 | Kelley et al. | |
| 6,583,458 B1* | 6/2003 | Hayashi et al. | 257/296 |
| 6,747,303 B2* | 6/2004 | Schroeder | 257/296 |
| 6,798,011 B2* | 9/2004 | Adan | 257/312 |
| 6,809,360 B2* | 10/2004 | Kato | 257/295 |
| 6,956,261 B2* | 10/2005 | Shibata | 257/306 |
| 7,020,039 B2* | 3/2006 | Tran et al. | 365/222 |
| 7,022,531 B2* | 4/2006 | Ozaki et al. | 438/3 |
| 7,196,379 B2* | 3/2007 | Morishita et al. | 257/357 |
| 7,200,038 B2* | 4/2007 | Lee et al. | 365/185.05 |
| 2002/0005543 A1* | 1/2002 | Di Pede et al. | 257/314 |
| 2002/0015327 A1* | 2/2002 | McPartland et al. | 365/185.03 |
| 2004/0257107 A1* | 12/2004 | Kim | 324/769 |
| 2005/0030827 A1* | 2/2005 | Gilliland et al. | 365/232 |
| 2007/0019477 A1* | 1/2007 | Diorio et al. | 365/185.18 |
| 2007/0145467 A1* | 6/2007 | Park et al. | 257/315 |
| 2008/0001186 A1* | 1/2008 | Shastri et al. | 257/277 |
| 2008/0054331 A1* | 3/2008 | Chen et al. | 257/315 |

FOREIGN PATENT DOCUMENTS

| | | |
|---|---|---|
| JP | 10-223782 | 8/1998 |
| JP | 2001-185632 | 7/2001 |
| JP | 2001-511308 | 8/2001 |
| JP | 2005-57106 | 3/2005 |
| WO | WO-98/19343 | 5/1998 |

* cited by examiner

| Action | Target Cell | Vb | Vs | Vwa | Vwb |
|---|---|---|---|---|---|
| Program | Selected Cell | 4~12V | 0V | 12~16V | 12~16V |
| | First Selected Cell | 4~12V | 0V | 0V | 0V |
| | Second Selected Cell | 0V | 0V | 12~16V | 12~16V |
| | Third Selected Cell | 0V | 0V | 0V | 0V |
| Read | Selected Cell | 1V | 0V | 1.8~5V | 1.8~5V |
| | First Selected Cell | 1V | 0V | 0V | 0V |
| | Second Selected Cell | 0V | 0V | 1.8~5V | 1.8~5V |
| | Third Selected Cell | 0V | 0V | 0V | 0V |
| Erase | Selected Cell | 4~16V | Floating | 0V | −12~−16V |
| | First Selected Cell | 4~16V | 0V | 0V | 0V |
| | Second Selected Cell | 0V | Floating | 0V | −12~−16V |
| | Third Selected Cell | 0V | 0V | 0V | 0V |

Fig. 4

| Action | Target Cell | Vb | Vs | Vwa | Vwb |
|---|---|---|---|---|---|
| Erase | Selected Cell | 4~16V | Floating | 0.8~6V | −12~−16V |
| | First Selected Cell | 4~16V | 0V | 0V | 0V |
| | Second Selected Cell | 0V | Floating | 0.8~6V | −12~−16V |
| | Third Selected Cell | 0V | 0V | 0V | 0V |

Fig. 6

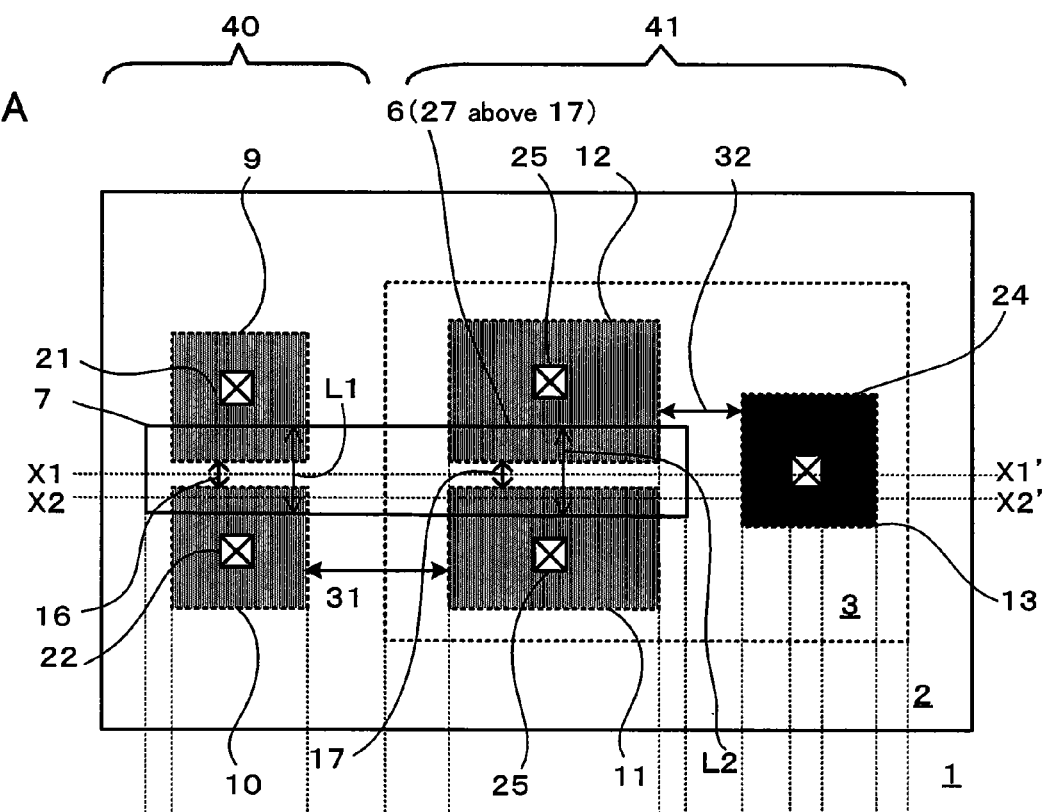
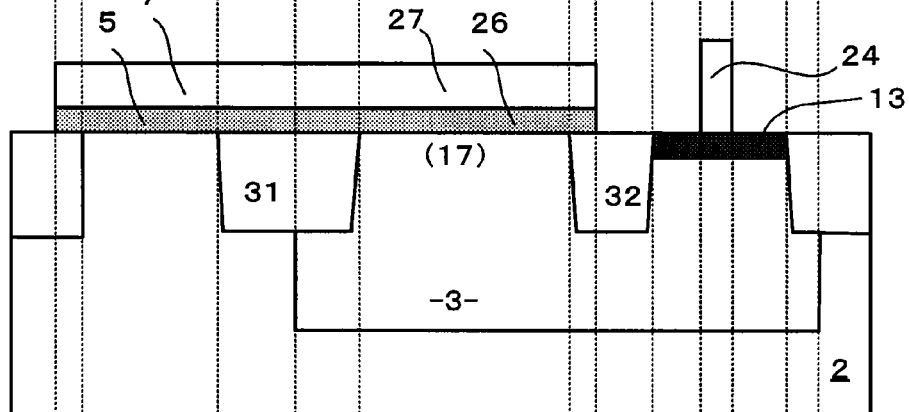
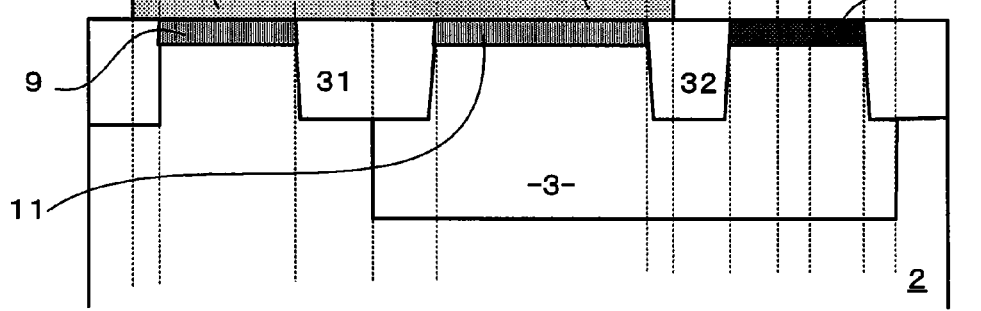
Fig. 8A
Fig. 8B
Fig. 8C

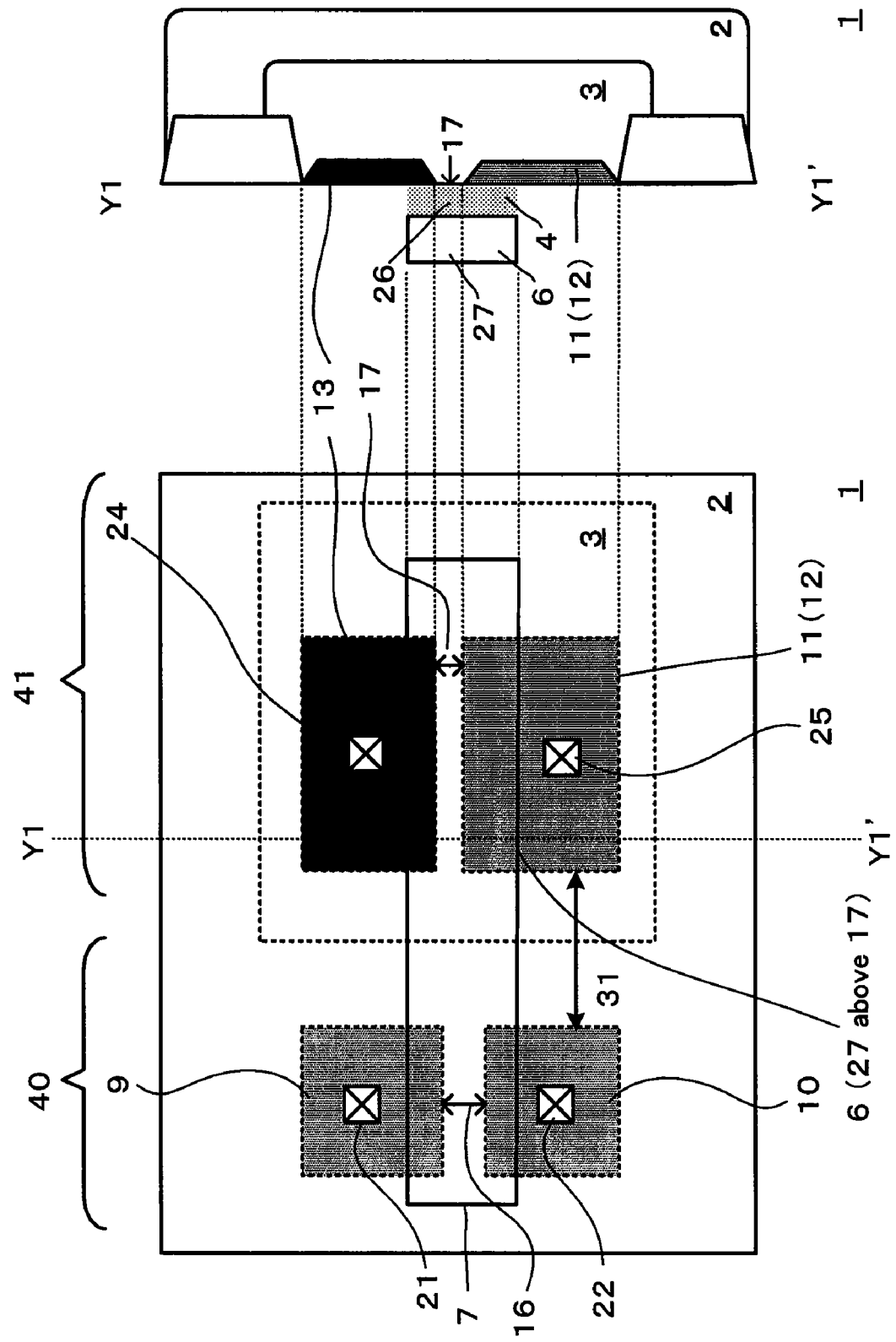

MEMORY CELL HAVING FIRST AND SECOND CAPACITORS WITH ELECTRODES ACTING AS CONTROL GATES FOR NONVOLATILE MEMORY TRANSISTORS

CROSS REFERENCE TO RELATED APPLICATION

This Nonprovisional application claims priority under 35 U.S.C. §119(a) on Patent Application No. 2006-305230 filed in Japan on 10 Nov., 2006 and Patent Application No. 2007-080280 filed in Japan on 26 Mar., 2007 the entire contents of which are hereby incorporated by reference.

BACKGROUND OF THE INVENTION

1. Field of the Invention

The present invention relates to a memory cell and more particularly, to a memory cell that can be mounted on a substrate in a standard CMOS process and written with information electrically. In addition, the present invention relates to an erasing method of information recorded in the memory cell and a nonvolatile semiconductor memory device comprising the plurality of memory cells.

2. Description of the Related Art

Conventionally, there is provided a nonvolatile semiconductor memory device that can be provided in the standard CMOS process without adding a new process to the process and write information electrically (refer to Japanese Laid-Open Patent Publication No. 6-334190 (referred to as the patent document 1 hereinafter), for example). A constitution of a nonvolatile semiconductor memory device disclosed in the patent document 1 will be described with reference to FIG. 13. FIG. 13A is a schematic sectional view showing a memory cell provided in the nonvolatile semiconductor memory device disclosed in the patent document 1 and FIG. 13B is an equivalent circuit thereof.

According to a memory cell 100 shown in FIG. 13A, an N-type well 3 is formed on a P-type semiconductor substrate 2, and P-type impurity diffusion layers 11 and 12 and an N+ type impurity diffusion layer 13 are formed on the well 3. In addition, the P-type impurity diffusion layer 12 and the N+ type impurity diffusion layer 13 are separated by an element separating insulation film 32.

In addition, N-type impurity diffusion layers 9 and 10 are separately formed on the semiconductor substrate 2 in a region in which the N-type well 3 is not formed (referred to as the "region outside the well" occasionally hereinafter). In addition, the N-type impurity diffusion layer 10 and the P-type impurity diffusion layer 11 formed on the N-type well 3 are separated by an element separating insulation film 31.

In addition, a first gate electrode 7 is formed above the region outside the well through a first gate insulation film 5 so as to overlap with a region sandwiched by the N-type impurity diffusion layers 9 and 10. Meanwhile, a second gate electrode 6 is formed above the N-type well 3 through a second gate insulation film 4 so as to overlap with a region sandwiched by the P-type impurity diffusion layers 11 and 12. In addition, the first gate electrode 7 and the second gate electrode 6 are electrically connected through a conductor 8.

In addition, the memory cell 100 comprises a contact 21 electrically connected to the N-type impurity diffusion layer 9, a contact 22 electrically connected to the N-type impurity diffusion layer 10, and a contact 23 electrically connected to the P-type impurity diffusion layers 11 and 12 and the N+ type impurity diffusion layer 13. As shown in FIG. 13A, the P-type impurity diffusion layers 11 and 12 and the N+ type impurity diffusion layer 13 are connected to the same node and when a predetermined voltage is applied from the contact 23, the same voltage is applied uniformly to the diffusion layers 11, 12 and 13.

Thus, the nonvolatile semiconductor memory device having the conventional constitution is provided by comprising memory cell array in which the above memory cells 100 are arranged in a row direction and a column direction. At this time, the memory cells having predetermined positional relation are electrically connected by a plurality of bit lines, word lines, and source lines. In the following description, it is assumed that the contact 21, the contact 22 and the contact 23 are connected to the bit line, the source line, the word line, respectively.

That is, the memory cell 100 shown in FIG. 13A comprises a MOS transistor 40 including the P-type semiconductor substrate 2, the N-type impurity diffusion layer 9, the N-type impurity diffusion layer 10, the first gate insulation film 5 and the first gate electrode 7, and a MOS capacitor 41 including the N-type well 3, the P-type impurity diffusion layer 11, the P-type impurity diffusion layer 12, the second gate insulation film 4 and the second gate electrode 6. Thus, the first gate electrode 7 constituting the MOS transistor 40 and the second gate electrode 6 constituting the MOS capacitor 41 are connected through the conductor 8, and the first gate electrode 7 is electrically insulated from the semiconductor substrate 2 and the N-type impurity diffusion layers 9 and 10 by the first gate insulation film 5, and the second gate electrode 6 is electrically insulated from the N-type well 3 and the P-type impurity diffusion layers 11 and 12 by the first gate insulation film 4, whereby the first gate electrode 7 and the second gate electrode 6 (and the conductor 8 electrically connecting them) constitute a floating gate electrode FG (refer to FIG. 13B).

In the memory cell 100 constituted as described above, it is assumed that a predetermined first positive voltage is applied to the N-type impurity diffusion layer 9 through the contact 21, the ground voltage is applied to the N-type impurity diffusion layer 10 through the contact 22, and a predetermined second positive voltage higher than the first positive voltage is applied to the P-type impurity diffusion layers 11 and 12 and the N+ type impurity diffusion layer 13 through the contact 23 (this voltage applying condition is referred to as the "first voltage state" hereinafter). At this time, when the second positive voltage is sufficiently higher than the charged potential of the second gate electrode 6, in other words, when the potential of the second gate electrode 6 is sufficiently lower than the potentials of the N-type well 3 and the P-type impurity diffusion layers 11 and 12, an inversion layer is formed at the interface between the N-type well 3 and the second gate insulation film 4 under the second gate electrode 6 (referred to as the "capacitor side inversion layer" hereinafter). At this time, since a minority-carrier hole in the capacitor side inversion layer is supplied from the adjacent P-type impurity diffusion layers 11 and 12, the potential of the inversion layer is coupled to the second positive voltage.

Here, predetermined capacitance is provided between the capacitor side inversion layer and the second gate electrode 6 depending on a dimension and a material. Meanwhile, in the first gate electrode 7 electrically connected to the second gate electrode 6 also, when the potential of the first gate electrode is sufficiently higher than that of the semiconductor substrate 2 in the positive direction at the overlapping part of the first gate electrode 7 and the semiconductor substrate 2, an inversion layer is generated at the interface between the semiconductor substrate 2 and the first gate insulation film 5 (referred to as the "transistor side inversion layer" hereinafter) under the first gate electrode 7, so that predetermined capacitance is provided between the transistor side inversion layer and the first gate electrode 7 depending on a dimension and a material.

When it is assumed that the potential of the semiconductor substrate 2 is the ground potential in the above first voltage state, the potential difference of the second positive voltage is generated between the semiconductor substrate 2 and the capacitor side inversion layer. Since the second gate electrode 6 and the first gate electrode 7 are electrically connected and have the same potential, the second gate electrode 6 and the first gate electrode 7 (that is, the floating gate electrode FG) have a predetermined positive potential determined by the capacitance with the capacitor side inversion layer and the capacitance with the transistor side inversion layer (potential is increased).

At this time, when the potential of the first gate electrode 7 becomes higher than the semiconductor substrate 2 and its potential difference is sufficiently high, the transistor side inversion layer is formed at the interface between the overlapping part of the first gate electrode 7 and the semiconductor substrate 2, and the first gate insulation film 6 as described above. In the above first voltage state, the first positive voltage is applied to the N-type impurity diffusion layer 9 through the contact 21 and the ground voltage is applied to the N-type impurity diffusion layer 10 through the contact 22, so that the positive electric field is generated from the N-type impurity diffusion layer 10 to the N-type impurity diffusion layer 9 and the electrons in the N-type impurity diffusion layer 10 are accelerated by that electric field and become hot electrons. This hot electron is drawn to the high voltage state of the first gate electrode 7 and as a result, injected in the floating gate electrode FG. Thus, the floating gate electrode FG is negatively charged.

In the MOS transistor 40, the voltage value to be applied to the N-type well 3 through the contact 23 to form the transistor side inversion layer varies depending on the amount of the electrons accumulated in the floating gate electrode FG. That is, in a case where a predetermined third positive voltage is applied through the contact 23 and a predetermined fourth positive voltage is applied to the N-type impurity diffusion layer 9 through the contact 21, when the transistor side inversion layer is formed and the MOS transistor 40 becomes conductive, the electrons are not sufficiently accumulated in the floating gate electrode FG. Meanwhile, when the transistor side inversion layer is not formed and the MOS transistor 40 is in the nonconductive state, it means that the electrons are sufficiently accumulated in the floating gate electrode FG. In general, the case where the floating gate electrode FG accumulates electrons sufficiently and negatively charged is a programmed state and the reverse case is a non-programmed state.

That is, the information of the memory cell 100 is read by applying the fourth positive voltage to the N-type impurity diffusion layer 9 through the contact 21, applying the ground voltage to the N-type impurity diffusion layer 10 through the contact 22, and applying the third positive voltage to each of the P-type impurity diffusion layers 11 and 12 and the N+ type impurity diffusion layer 13 through the contact 23 (this voltage applying condition is referred to as the "second voltage state" hereinafter) to determine whether a current flowing in the bit line connected to the contact 21 or a current flowing in the source line connected to the contact 22 is detected or not and relate the determined result to two values 0 and 1.

As described above, the information is programmed by setting the first voltage state to the memory cell 100 and the information is read by setting the second voltage state to it. In addition, since the floating gate electrode FG that is negatively charged when the hot electron is injected in the programming process is surrounded by the insulation films (first gate insulation film 4 and the second gate insulation film 5), the charge is not volatile, so that the charged state can be maintained for a long period of time. In addition, since the programming process or the reading process on the memory cell 100 is selected by the voltage applied from the contact 23, the P-type impurity diffusion layers 11 and 12 and the N+ type impurity diffusion layer 13 receiving the voltage from the contact 23 corresponds to the control gate electrode (referred to as the control gate electrode CG (not shown in the drawing) hereinafter) when the memory cell 100 is regarded as one memory cell in the nonvolatile semiconductor memory device.

Next, a description will be made of a case where the floating gate electrode FG is negatively charged and information stored in the memory cell 100 is erased.

When the erasing action is performed, the ground voltage is applied to the P-type impurity diffusion layers 11 and 12 and the N+ type impurity diffusion layer 13 through the contact 23, a predetermined fifth positive voltage (the same as the first positive voltage or more) is applied to the N-type impurity diffusion layer 9 through the contact 21, and the contact 22 is set in the floating (high-impedance) state (this voltage applying condition is referred to as the "third voltage state" hereinafter). At this time, a potential difference is generated between the floating gate electrode FG (first gate electrode 7) and the N-type impurity diffusion layer 9 and a high electric field is generated, so that electrons accumulated in the floating gate electrode FG are withdrawn to the N-type impurity diffusion layer 9 by a FN (Fowler Nordheim) tunneling phenomenon, whereby the programmed state is canceled. In addition, in this case, the electrons may be withdrawn by applying the fifth positive voltage to the N-type impurity diffusion layer 10 through the contact 22 as well to generate a high electric field from the floating gate electrode FG to the surface of the opposed semiconductor substrate 2.

In addition, as another erasing method, a method in which a hot hole is injected to the floating gate electrode FG is disclosed (refer to Boaz Eitan et al., "Can NROM, a 2 Bit, Trapping Storage NVM Cell, Give a real Challenge to Floating Gate Cells?", Extended Abstracts of the 1999 International Conference on Solid State Devices and Materials, Tokyo, 1999, p. 522-523, (referred to as the document 2 hereinafter), for example). The method disclosed in the above document is applied to the memory cell shown in FIG. 13 as follows. That is, a voltage from the ground potential through to the negative voltage is applied to the control gate electrode CG and a predetermined positive voltage is applied to the N-type impurity diffusion layer 9 through the contact 21. At this time, a high potential difference having an opposite polarity is generated between the N-type impurity diffusion layer 9 and the control gate electrode CG and as a result, the surface of the N-type impurity diffusion layer 9 becomes a deep deficiency sate and an energy band bends abruptly. At this time, the electrons tunnels from a valence band to a conductive band by the band-to-band tunneling. At this time, a pair of electron and hole is generated and the electron flows in the N-type impurity diffusion layer 9 and absorbed while the hole is accelerated in a horizontal direction by an electric field in the horizontal direction between the N-type impurity diffusion layer 9 and the semiconductor substrate 2 (assuming that the semiconductor substrate 2 is at the ground potential) and becomes a hot hole. Thus, the hot hole is drawn to the positive voltage state that is close to the ground potential of the first gate electrode 7 and then injected to the floating gate electrode FG (band-to-band tunneling induced hot hole injection). The electron accumulated in the floating gate electrode FG is offset with the hot hole and the negatively charged state is canceled, whereby information is erased.

In addition, although the erasing method using the FN tunneling phenomenon and the erasing method using the hot hole injection are similar in the voltage applying method, they are different in that the former method needs to use an extremely thin gate insulation film to increase the inner electric field of the insulation film sufficiently to the degree that the tunneling phenomenon is generated within a practically applicable voltage range, while the latter method does not need to use the extremely thin gate insulation film.

According to the erasing method disclosed in the above document 1, the high electric field is generated between the floating gate electrode FG and the N-type impurity diffusion layer 9 by generating the high potential difference between the control gate electrode CG and the N-type impurity diffusion layer 9, and the electrons accumulated in the floating gate electrode FG are withdrawn by the high electric field, whereby the information is erased. That is, as the potential difference between the control gate electrode CG and the N-type impurity diffusion layer 9 is increased, the erasing ability can be enhanced. Here, as a method to increase the potential difference, a first method to lower the voltage applied from the contact 23 (to a negative voltage) and a second method to raise the voltage applied from the contact 21 (to a positive high voltage) are considered.

However, when the first method is used, that is, when the negative voltage is applied from the contact 23, the junction between the N-type well 3 to which the negative voltage is applied and the P-type semiconductor substrate 2 is in the forward direction and both show conductive state, so that the original function of the memory cell, that is, to store information could not be implemented. In addition, in the case of the second method is used, that is, in the case where the voltage applied from the contact 21 is increased, when the voltage is increased to the degree that erasing ability can be provided, it exceeds the withstand voltage of the N-type impurity diffusion layer 9 in some cases. In this case, the diffusion layer 9 could be destroyed and the original function of the memory cell, that is, to store information could not be implemented. That is, the applicable voltage value from the contact 21 is limited by the withstand voltage of the N-type impurity diffusion layer 9. Conversely, in order to increase the withstand voltage of the N-type impurity diffusion layer 9, it is necessary to correct an impurity density distribution of the N-type impurity diffusion layer 9, so that it is difficult to implement the above process in the standard CMOS manufacturing process without adding a new step.

Therefore, when the voltage value within a range not exceeding the withstand voltage of the N-type impurity diffusion layer 9 is applied from the contact 21, in order to provide the erasing ability efficiently (in order to sufficiently increase the inner electric field of the insulation film to the degree that the tunneling phenomenon is generated within the practically applicable voltage range), there is a method of thinning the thickness of the first gate insulation film 5 in order to increase the electric field between the floating gate electrode FG (first gate electrode 7) and the N-type impurity diffusion layer 9. However, in this method, the electrons accumulated in the floating gate electrode FG after the programming process could escape through the thin insulation film (corresponding to the above-described extremely thin gate insulation film) even though the erasing action is not performed (electric charge retention reliability is lowered).

In addition, according to the method disclosed in the above document 2, since it is necessary to apply the negative voltage from the contact 23 to generate the hot hole, it cannot be employed in the memory cell comprising the constitution shown in FIG. 13 for the same reason as the above.

SUMMARY OF THE INVENTION

The present invention was made in view of the above problems and it is an object of the present invention to provide a nonvolatile memory cell that can be mounted in a CMOS manufacturing process, and is capable of implementing high level of programming, reading and erasing ability. The present invention also relates to an erasing method of information recorded in the memory cell and a nonvolatile semiconductor memory device comprising a plurality of the memory cells.

A memory cell according to the present invention to attain the above object comprises a semiconductor substrate having a first conductivity type, two first impurity diffusion layers separately formed on the semiconductor substrate and having a second conductivity type different from the first conductivity type, a first gate electrode formed above a region containing at least a region sandwiched by the two first impurity diffusion layers through a first gate insulation film, a second impurity diffusion layer having the first conductivity type and formed above the semiconductor substrate so as to be separated from the semiconductor substrate by an impurity diffusion layer having the second conductivity type, a third impurity diffusion layer having the second conductivity type and formed on the semiconductor substrate, a second gate electrode formed above a region containing at least the second impurity diffusion layer through a second gate insulation film, and a third gate electrode formed above a region containing at least the third impurity diffusion layer through a third gate insulation film, a MOS transistor comprising the semiconductor substrate, the first impurity diffusion layer, the first gate insulation film, and the first gate electrode, a first capacitor comprising the second impurity diffusion layer, the second gate insulation film, and the second gate electrode, a second capacitor comprising the third impurity diffusion layer, the third gate insulation film, and the third gate electrode, and a nonvolatile memory transistor in which one of the two first impurity diffusion layers is a source diffusion region, the other thereof is a drain diffusion region, the first gate electrode, the second gate electrode, and the third gate electrode are electrically connected to constitute a floating gate electrode, the second impurity diffusion layer constituting one electrode of the first capacitor is a first control gate electrode, and the third impurity diffusion layer constituting one electrode of the second capacitor is a second control gate electrode, and it is characterized as first characteristics in that a different voltage can be applied to each of the first control gate electrode and the second gate electrode.

According to the memory cell having the above first characteristic constitution in the present invention, since the different voltage can be applied to each of the second impurity diffusion layer and the third impurity diffusion layer having the conductivity type different form that of the second impurity diffusion layer, while the voltage is applied to the third impurity diffusion layer so that the third impurity diffusion layer and the semiconductor substrate are not forwardly connected, the voltage having the polarity different from that of the voltage applied to the first impurity diffusion layer can be applied to the second impurity diffusion layer. Therefore, a high potential difference can be generated between the floating gate electrode and the first impurity diffusion layer, so that the accumulated information can be correctly erased by changing the charged state of the floating gate electrode.

In addition, since the memory cell comprises the semiconductor substrate, the well, the gate electrode, and the impurity diffusion layer, it can be manufactured in the general CMOS manufacturing process without adding a new process.

In addition, the memory cell according to the present invention is characterized as second characteristics in that a part of the junction between the second impurity diffusion layer and the third impurity diffusion layer is in contact with the second gate insulation film positioned under the second gate electrode, or the third gate insulation film positioned under the third gate electrode, in addition to the first characteristic constitution.

According to the memory cell having the second characteristic constitution in the present invention, when the second impurity diffusion layer and the third impurity diffusion layer having different conductivity types form the junction under the second insulation film constituting the first capacitor or under the third gate insulation film constituting the second capacitor, since the second impurity diffusion layer and the third impurity diffusion layer try to compensate the supply of a minority carrier, capacitive couplings between the second impurity diffusion layer and the third gate electrode, and between the third impurity diffusion layer and the second gate electrode can be stably implemented. That is, when the second impurity diffusion layer surface becomes the inversion condition, the surface of the third impurity diffusion layer adjacent to the second impurity diffusion layer and having the different conductivity type becomes an accumulated condition, so that the capacitive coupling with the floating gate can be ensured and the minority carrier is supplied to the second impurity diffusion layer, whereby the potential of the inversion layer of the second impurity diffusion layer surface can be controlled, so that the capacitive coupling between the third impurity diffusion layer and the second gate electrode can be stably implemented. Conversely, when the third impurity diffusion layer surface becomes the inversion condition, the surface of the second impurity diffusion layer adjacent to the third impurity diffusion layer and having the different conductivity type becomes an accumulated condition, so that the capacitive coupling with the floating gate can be ensured and the minority carrier is supplied to the third impurity diffusion layer, whereby the potential of the diffusion layer of the second impurity diffusion layer surface can be controlled so that the capacitive coupling between the second impurity diffusion layer and the third gate electrode can be stably implemented. Thus, the ability to cancel the charged state, that is, the erasing ability in the floating gate electrode can be enhanced.

In addition, the memory cell according to the present invention is characterized as third characteristics in that the area of the first capacitor is equal to or more than the area of the second capacitor, in addition to the first or the second characteristic constitution.

For example, when the erasing process is performed by applying the negative voltage to the second impurity diffusion layer and applying the ground voltage to the third impurity diffusion layer in the memory cell of the present invention in which information is programmed by injecting a hot electron to the floating gate electrode, as the erasing process proceeds and the negative charge of the floating gate electrode is eliminated and the threshold voltage of the memory cell is lowered, the potential difference between the floating gate electrode and the third impurity diffusion layer (channel region) positioned under the third gate electrode becomes small, so that the channel region becomes the weak inversion condition and cannot maintain the strong inversion condition. At this time, since the most part of the channel region is at the potential between the floating gate electrode and the third impurity diffusion layer, the capacitive coupling of the potential of the floating gate electrode to the negative voltage deteriorates and the erasing speed is lowered.

Meanwhile, according to the third characteristic constitution of the memory cell in the present invention, since the capacity of the first capacitor is stably ensured against the potential fluctuation of the floating electrode, even when the erasing process proceeds and the charge of the floating gate electrode is eliminated and the capacitive coupling of the second capacitor deteriorates for the above reason, the capacitive coupling between the first control gate electrode and the floating electrode can be maintained, so that the erasing speed can be prevented from being reduced.

In addition, the memory cell according to the present invention is characterized as fourth characteristics in that the first gate electrode, the second gate electrode, and the third gate electrode are integrally formed of the same conductivity material, in addition to any one of the first to third characteristic constitution.

According to the fourth characteristic constitution of the memory cell in the present invention, since the first gate electrode, the second gate electrode, and the third gate electrode can be formed in the same process, the manufacturing process can be simplified.

In addition, the memory cell according to the present invention is characterized as fifth characteristics in that the first gate insulation film, the second gate insulation film, and the third gate insulation film are formed of the same material in the same process, in addition to any one of the first to fourth characteristic constitution.

According to the fifth characteristic constitution of the memory cell in the present invention, since the first gate insulation film, the second gate insulation film, and the third gate insulation film can be formed in the same process, the manufacturing process can be simplified.

In addition, the memory cell according to the present invention is characterized as sixth characteristics in that the film thicknesses of the first gate insulation film, the second gate insulation film, and the third gate insulation film are thicker than the thinnest insulation film among a plurality of gate insulation films manufactured in a manufacturing process of a semiconductor chip comprising the nonvolatile memory transistor, in addition to the fifth characteristic constitution.

In general, the high withstand voltage CMOS transistor provided in a standard logic CMOS transistor process of a semiconductor chip product having a plurality of chip inner power supply voltages has an gate insulation film thicker than the standard logic CMOS transistor, a gate length longer than the standard logic transistor, a low surface impurity density of a semiconductor substrate, and a drain impurity diffusion layer having a lower density under the gate electrode.

According to the sixth characteristic constitution of the memory cell in the present invention, since the memory cell in the present invention does not use an extremely thin tunnel insulation film, the electron accumulated in the floating gate electrode after the programming process is prevented from escaping through the extremely thin insulation film even though the erasing action is not performed (electric charge retention reliability is lowered). That is, the charge retention reliability can be kept at high level as compared with the case where the extremely thin tunnel insulation film is used. In addition, since the high potential difference can be generated between the floating gate electrode and the first impurity diffusion layer, the erasing ability can be satisfactorily provided without using the extremely thin tunnel insulation film.

At this time, the film thicknesses of the first gate insulation film, the second gate insulation film, and the third gate insulation film can be 12 nm or more.

In addition, the memory cell according to the present invention is characterized as seventh characteristics in that the third impurity diffusion layer is the second conductivity type of well formed on the semiconductor substrate, and the second impurity diffusion layer is the first conductivity type of impurity diffusion layer formed in the well, in addition to any one of the first to sixth characteristic constitutions.

According to the seventh characteristic constitution of the memory cell according to the present invention, the memory cell of the present invention can be implemented without adding a new process to the general CMOS manufacturing process.

In addition, the memory cell according to the present invention is characterized as eighth characteristics in that in a high withstand voltage MOS transistor arranged at a part of a peripheral logic circuit region other than the region of the nonvolatile memory transistor, the second impurity diffusion layer is formed together with an impurity diffusion layer which is adjacent to the drain diffusion region of the high withstand voltage MOS transistor and extends at least from the end of the drain diffusion region to a part of the region under the gate electrode of the high withstand MOS transistor and has the same conductivity type as that of the drain diffusion region, in addition to any one of the first to seventh characteristic constitutions.

In general, the high withstand CMOS transistor consolidated in the standard logic CMOS transistor process has the impurity diffusion layer having the same conductivity type as the drain diffusion region of the high withstand MOS transistor and arranged adjacent to the drain diffusion region and extending at least from the end of the drain diffusion region to a part of the region under the gate electrode of the high withstand voltage MOS transistor. This impurity diffusion layer has a density lower than that of the drain of the standard logic CMOS transistor and an enough overlapping area with the gate electrode.

According to the eighth characteristic constitution in the present invention, when a part of the manufacturing process of the high withstand MOS transistor arranged at a part of the peripheral logic circuit region, that is, an impurity iontophoretic process to form the impurity diffusion layer is applied to the second impurity diffusion layer in the memory cell of the present invention as it is, the second impurity diffusion layer constituting the first capacitor can be formed without adding a new process to the manufacturing process of the high withstand voltage MOS transistor in the peripheral logic circuit.

In addition, the memory cell according to the present invention is characterized as ninth characteristics in that at least one part of the second impurity diffusion layer is defined as an injection region by a photoresist with lithography, separately from the region of the second gate electrode, in addition to any one of the first to eighth characteristic constitutions.

Since the capacity of the first capacitor is proportional to the area of the overlapping part between the second impurity diffusion layer and the second gate electrode, it is necessary to sufficiently provide the overlapping dimension between the second impurity diffusion layer and the second gate electrode in order to secure enough capacitance of the first capacitor. According to the ninth characteristic constitution in the present invention, since the injection region is defined separately from the second gate electrode, a large area can be set freely as compared with the case where the overlapping dimension is limited by a diffusion distance of the injected impurity when the injection region of the second impurity diffusion layer is formed by self alignment in the horizontal direction, so that sufficient capacitance can be ensured in the first capacitor. That is, the potential of the second impurity diffusion layer can be transmitted to the floating gate with high efficiency, whereby the satisfactory erasing ability can be ensured.

In addition, the memory cell according to the present invention is characterized as tenth characteristics in that when the two second impurity diffusion layers are separately formed in the well, a dimension of the first gate electrode in the opposed direction of the two first impurity diffusion layers is equal to the sum of the dimensions of the second gate electrode and the third gate electrode in the opposed direction of the two second impurity diffusion layers, in addition to any one of the first to ninth characteristic constitutions.

According to the tenth characteristic constitution of the memory cell in the present invention, since the degree of variation of the dimension of the first gate electrode in the opposed direction of the two first impurity diffusion layers is about the same as that of the second gate electrode and the third gate electrode in the opposed direction of the two second impurity diffusion layers, a variation in potential of the floating gate electrode when a predetermined voltage is applied to the first impurity diffusion layer and the second impurity diffusion layer is suppressed, so that the memory cell can operate stably.

In addition, the memory cell according to the present invention is characterized as eleventh characteristics in that the first conductivity type is a P-type and the second conductivity type is an N-type, in addition to any one of the first to tenth characteristic constitutions.

In addition, an erasing method of information recorded in the memory cell according to the present invention in order to attain the above object is used, to erase the information recorded in the memory cell having the first characteristic constitution, is characterized as first characteristics in that the information is erased by applying a first erasing voltage having a polarity constituting a reverse junction (reverse bias) with the semiconductor substrate to the first impurity diffusion layer, a second erasing voltage having a polarity different from that of the first erasing voltage to the first control gate electrode, and a ground voltage to the second control gate electrode.

In addition, the erasing method according to the present invention to erase the information recorded in the memory cell having the first characteristic constitution, is characterized as second characteristics in that the information is erased by applying a first erasing voltage having a polarity constituting a reverse junction (reverse bias) with the semiconductor substrate to the first impurity diffusion layer, a second erasing voltage having a polarity different from that of the first erasing voltage to the first control gate electrode, and a third erasing voltage having a polarity different from that of the second erasing voltage to the second control gate electrode.

In addition, the erasing method according to the present invention to erase the information recorded in the memory cell having the eleventh characteristic constitution, is characterized as third characteristics in that the information is erased by applying a first erasing voltage having a positive polarity to the first impurity diffusion layer, a second erasing voltage having a negative polarity to the first control gate electrode, and the ground voltage to the second control gate electrode.

In addition, the erasing method according to the present invention to erase the information recorded in the memory cell having the eleventh characteristic constitution, is characterized as fourth characteristics in that the information is erased by applying a first erasing voltage having a positive polarity to the first impurity diffusion layer, a second erasing voltage having a negative polarity to the first control gate electrode, and a third erasing voltage having the positive polarity to the second control gate electrode.

According to the first or third characteristics of the erasing method in the present invention, since the potential of the third impurity diffusion layer is at the ground potential, a forward connection is not formed between the third impurity diffusion layer and the substrate, and a high voltage can be generated between the floating gate electrode and the first impurity diffusion layer, so that the charged state of the floating gate electrode is canceled and the information can be correctly erased.

In addition, according to the second or fourth characteristics of the erasing method in the present invention, the third erasing voltage constituting the reverse junction with the semiconductor substrate is applied to the third impurity diffusion layer. Thus, sufficient resistance is provided against the case where the potential of the third impurity diffusion layer fluctuates due to the noise, the reverse bias is generated between the third impurity diffusion layer and the substrate and forward current flows between them. In addition, since the strong inversion condition can be easily maintained on the surface layer of the third impurity diffusion layer in the second capacitor comprising the third gate insulation film and the third gate electrode of the third impurity diffusion layer, the capacitive coupling can be easily provided between the second erasing voltage applied to the first control gate electrode (second impurity diffusion layer) and the second gate electrode becoming the floating gate electrode stably with high efficiency.

In addition, the erasing method of the present invention is characterized as fifth characteristics in that the third erasing voltage is set so that the potential of the third impurity diffusion layer is almost equal to that of a power supply voltage of a peripheral logic circuit, in addition to the second or fourth characteristics.

According to the fifth characteristics of the erasing method in the present invention, since it is not necessary to provide a dedicated circuit constituting a voltage source to generate the third erasing voltage, the nonvolatile semiconductor memory device can be reduced in size.

In addition, a nonvolatile semiconductor memory device according to the present invention in order to attain the above object comprises a memory cell array provided by arranging memory cells having any one of the first to eleventh characteristics in each of a row direction and a column direction, and it is characterized by comprising a plurality of first word lines to each of which the first control gate electrodes of the memory cells in the same row are commonly connected and a plurality of second word lines to each of which the second control gate electrodes of the memory cells in the same row are commonly connected, a plurality of bit lines to each of which the first impurity diffusion layers of the memory cells in the same column are commonly connected, a plurality of source lines to each of which the second impurity diffusion layers of the memory cells in the same column or the same row are commonly connected, and a voltage controlling means for controlling the voltage applied to each of the plurality of first word lines, the plurality of second word lines, the plurality of bit lines, and the plurality of the source lines.

According to the constitution of the present invention, there is provided a nonvolatile memory cell that can be mounted in the CMOS manufacturing process and have satisfactory programming, reading, and erasing abilities.

BRIEF DESCRIPTION OF THE DRAWINGS

FIG. 4 is a conceptual view showing a memory cell array comprising the memory cells according to the present invention;

FIG. 6 is a table showing a voltage applying condition in each memory cell when an erasing process is performed on the selected memory cell;

FIG. 8 is another example of a schematic view of a layout constitution in which a memory cell 1 of the present invention can be mounted;

FIG. 9 is another example of a schematic view of the layout constitution in which the memory cell 1 of the present invention can be mounted;

DETAILED DESCRIPTION OF THE PREFERRED EMBODIMENTS

An embodiment of a memory cell according to the present invention (referred to as the "memory cell of the present invention" occasionally hereinafter), an erasing method of information recorded in the memory cell of the present invention (referred to as the "method of the present invention" occasionally hereinafter), and a nonvolatile semiconductor memory device comprising the memory cell of the present invention (referred to as the "device of the present invention" occasionally hereinafter) will be described with reference to FIGS. 1 to 11. First, a description will be made of a constitution example of the whole device of the present invention and then a description will be made of a constitution and a layout of the memory cell of the present invention.

Description of Device of the Present Invention

Figure 1:
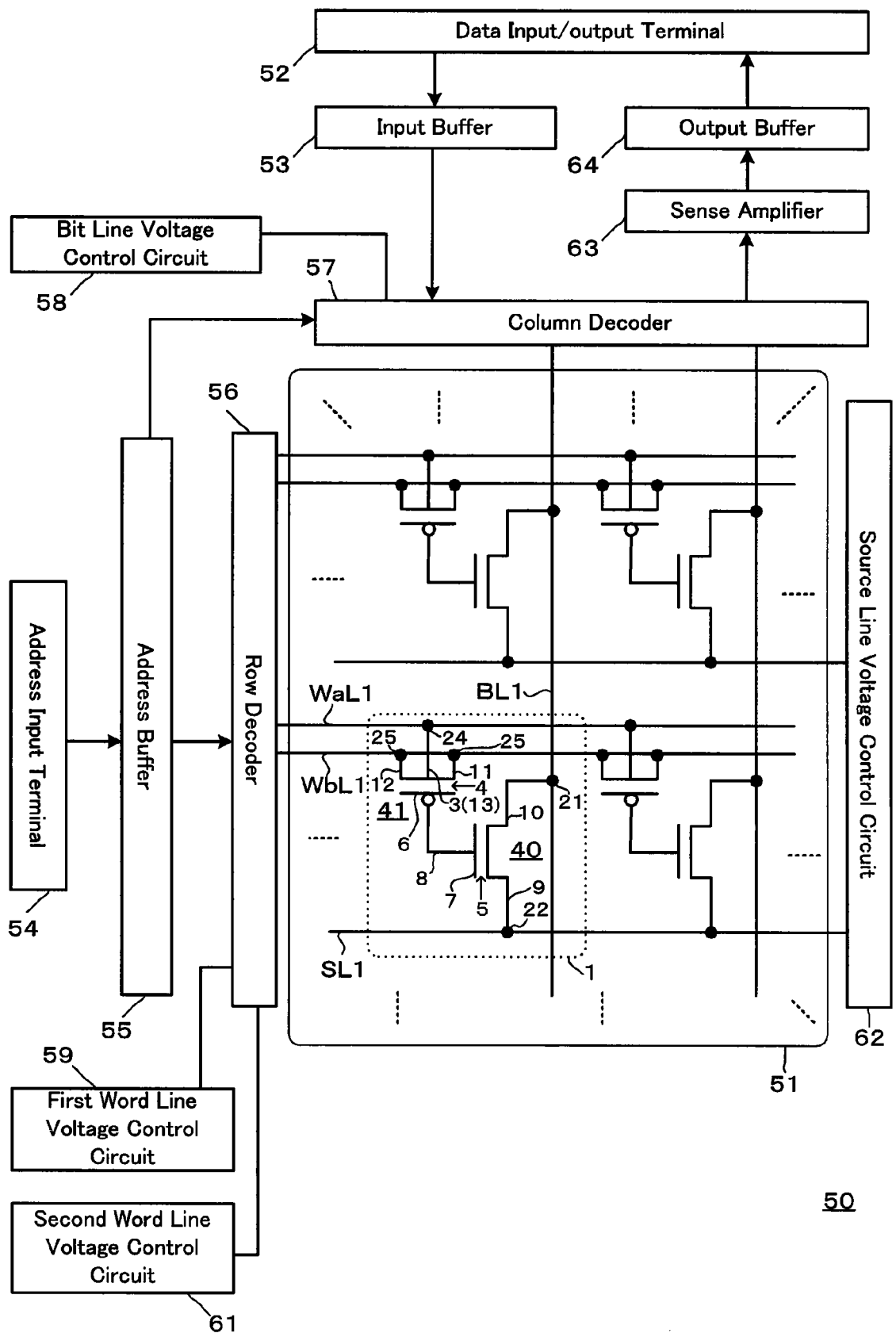
FIG. 1 is a block diagram showing one example of a whole schematic constitution of a nonvolatile semiconductor memory device according to the present invention.

FIG. 1 is a block diagram showing the whole schematic constitution of the nonvolatile semiconductor memory device of the present invention. As shown in FIG. 1, a device 50 of the present invention comprises a memory cell array 51 in which a plurality of memory cells are arranged in the shape of a matrix, a data input/output terminal 52, an input buffer 53, an address input terminal 54, an address buffer 55, a row decoder 56, a column decoder 57, a bit line voltage control circuit 58, a first word line voltage control circuit 59, a second word line voltage control circuit 61, a source line voltage control circuit 62, a sense amplifier 63, an output buffer 64, and control means (not shown) for controlling each control circuit and buffer and the like.

A memory cell array 21 is so constituted that electrically writable memory cells are arranged in each of a row direction and column direction in the shape of a matrix. Each memory cell comprises a MOS transistor and a MOS capacitor. At this time, a gate electrode of the MOS transistor (referred to as the "first gate electrode" hereinafter) and a gate electrode of the MOS capacitor (referred to as the "second gate electrode" hereinafter) in the same memory cell are electrically connected and electrically insulated from other terminals.

Thus, in the memory cells in the same row, diffusion regions (a drain diffusion region and source diffusion region) of the MOS capacitors are connected to the same word line (referred to as the "first word line" hereinafter), and back gate electrodes thereof are connected to the same common word line (referred to as the "second word line" hereinafter) different from the first word line, and source diffusion regions of the MOS transistors are connected to the same source line. In addition, in the memory cells in the same column, drain diffusion regions of the MOS transistors are connected to the same bit line.

The bit line voltage control circuit 58 controls the voltage of each bit line, the first word line voltage control circuit 59 controls the voltage of each first word line, the second word line voltage control circuit 61 controls the voltage of each second word line, and the source line voltage control circuit 62 controls the voltage of each source line.

When the address buffer 55 receives an address signal from the address input terminal 54, it separates the address signal into a column address and a row address and outputs them to the column decoder 57 and the row decoder 56, respectively. The column decoder 57 selects the bit line corresponding to the inputted column address, and the row decoder 56 selects the first and second word lines corresponding to the inputted row address. In addition, as for the source line, when each source line can be selected, the row decoder 56 selects the object source line, and when the same voltage is applied to each source line, a predetermined one voltage according to each process of programming, reading and erasing is applied commonly to all the source lines. Thus, data from the data input/output terminal 52 is inputted through the input buffer 53 and programmed in the memory cell selected by the column decoder 57 and the row decoder 56, or information programmed in the memory cell selected by the column decoder 57 and the row decoder 56 is read and amplified by the sense amplifier 63 and outputted to the data input/output terminal 52 through the output buffer 64.

Focusing on a memory cell 1 in the memory cell array 51, the memory cell 1 comprises a MOS transistor 40 and a MOS capacitor 41, a source diffusion region 9 of the MOS transistor 40 is connected to a source line SL1 through a contact 22, a drain diffusion region 10 thereof is connected to a bit line BL1 through a contact 21, and a first gate electrode 7 thereof is connected to a second gate electrode 6 of the MOS capacitor 41 through a conductor 8. In addition, diffusion regions 11 and 12 of the MOS capacitor 41 are connected to a first word line WbL1 through a contact 25, and a back gate of the MOS capacitor 41 is connected to a second word line WaL1 through a contact 24. In addition, the first gate electrode 7 is electrically insulated from the drain diffusion region 9 and the source diffusion region 10 by a first gate insulation film 5 in the MOS transistor 40, and the second gate electrode 6 is electrically insulated form the diffusion regions 11 and 12 by a second gate insulation film 4 in the MOS capacitor 41.

Description of Memory Cell of the Present Invention

Figure 2A:
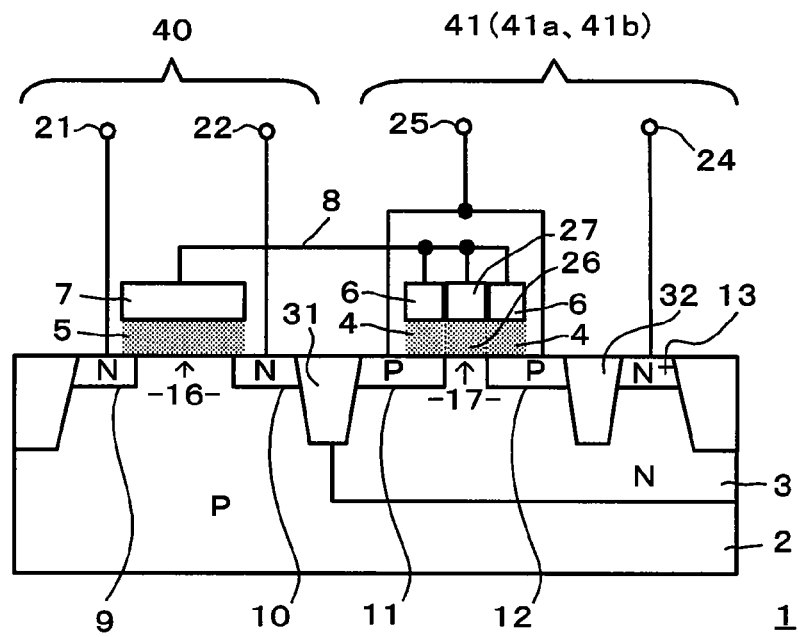
FIG. 2 is a schematic sectional structure view showing a memory cell according to the present invention.
Figure 2B:
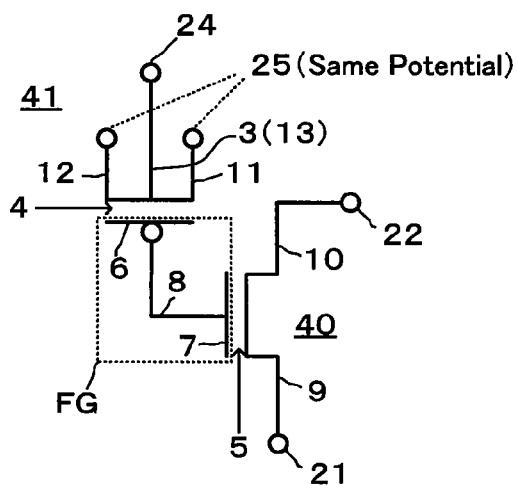
Figure 2C:
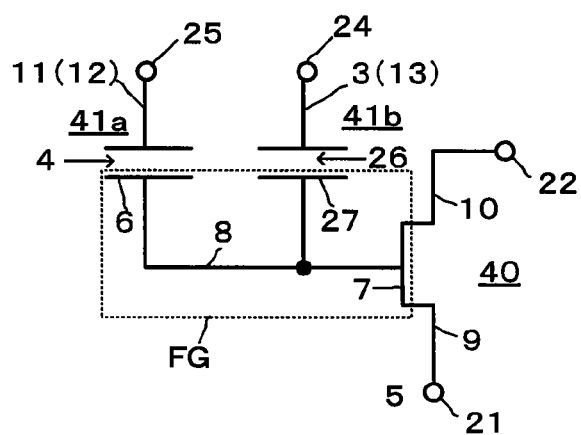

FIG. 2 is a view showing the constitution of the memory cell 1 shown in FIG. 1. FIG. 2A schematically shows a sectional structure of the memory cell 1, and FIG. 2B and FIG. 2C show its equivalent circuits. In addition, the schematic sectional structure in FIG. 2A is illustratively shown, since the reduction scale of the dimension of an actual structure and the reduction scale of the drawing do not always correspond to each other. In addition, the same references are allotted to the same parts as a memory cell having a conventional constitution shown in FIG. 13 and their description will be simplified.

According to the memory cell 1 shown in FIG. 2A, similar to the conventional constitution, the MOS transistor 40 and the MOS capacitor 41 are formed on a first conductivity type of semiconductor substrate 2 on which element separating insulation films (31 and 32 and the like) and a second conductivity type of well 3 are formed (referred to FIG. 2B), but the constitution of the present invention is different form the conventional constitution in that different voltages can be applied to a gate electrode (corresponding to an electrode 6 or an electrode 27 in FIG. 2A) of the MOS capacitor 41 and a well 3, respectively. Furthermore, the constitution of the present invention is different from the conventional constitution in that the MOS capacitor 41 comprises two MOS capacitors 41a and 41b having different characteristics (refer to FIG. 2C). This constitution will be described in detail hereinafter.

The MOS transistor 40 comprises the second conductivity type of impurity diffusion layers (referred to as the "first impurity diffusion layer" occasionally hereinafter) 9 and 10 separately formed on the semiconductor substrate 2, the first gate insulation film 5 deposited on the substrate 2, and the first gate electrode 7 deposited on the first gate insulation film 5. Here, a silicon oxide film may be used as the first gate insulation film 5, for example, and polysilicon may be used as the first gate electrode 7, for example. In addition, as shown in FIG. 2, the first gate electrode 7 is formed so as to overlap with a region (referred to as the "first channel region 16" occasionally hereinafter) sandwiched between the first impurity diffusion layers 9 and 10. In addition, the MOS transistor 40 comprises the contact 21 electrically connected to the first impurity diffusion layer 9 and the contact 22 electrically connected to the first impurity diffusion layer 10, so that different voltage can be applied to the first impurity diffusion layer 9 and the first impurity diffusion layer 10 from the bit line BL1 and the source line SL1, respectively.

As shown in FIG. 2C, the MOS capacitor 41 comprises the two MOS capacitors 41a and 41b. The MOS capacitor (referred to as the "first capacitor" hereinafter) 41a comprises first conductivity type of impurity diffusion layers (referred to as the "second impurity diffusion layer" occasionally hereinafter) 11 and 12 formed on the second conductivity type of well (referred to as the "third impurity diffusion layer" occasionally hereinafter) 3, or either one of them (when the second impurity diffusion layers 11 and 12 or either one of them is comprised, the description "second impurity diffusion layer 11 (12)" is used hereinafter), the second gate insulation film 4 deposited on the second impurity diffusion layer 11 (12), and the second gate electrode 6 deposited on the insulation film 4. Meanwhile, the other MOS capacitor (referred to as the "second capacitor" hereinafter) 41b comprises the third impurity diffusion layer 3, a third gate insulation film 26 formed on the third impurity diffusion layer 3, and a third gate electrode 27 deposited on the insulation film 26.

In addition, the second gate electrode 6 and the third gate electrode 27 are electrically connected and they may be integrally constituted as one gate electrode although the second gate electrode 6 and the third gate electrode 27 seem to be separately constituted in FIG. 2A. In other words, the constitution may be such that the second impurity diffusion layer 11 (12) overlaps with the second gate electrode 6, and a part of the junction part between the second impurity diffusion layer 11 (12) and the third impurity diffusion layer 3 is in contact with the gate insulation film under at least one of the second gate electrode 6 and the third gate electrode 27 (that is, either the second gate insulation film 4 or the third gate insulation film 26).

In addition, the arranged number of the second impurity diffusion layers 11 (12) and the arranging method thereof are not limited in the above constitution. That is, the second impurity diffusion layers 11 and 12 are not necessarily opposed to each other as shown in FIG. 2A, and they are not necessarily provided as a pair.

Here, similar to the first gate insulation film 5, the silicon oxide film may be used as the second gate insulation film 4 or the third drain insulation film 26, for example, and similar to the first gate electrode 7, polysilicon may be used as the second gate electrode 6 or the third gate electrode 27, for example. Thus, the contact 25 electrically connected to each of the second impurity diffusion layers 11 and 12 is provided, so that a voltage can be applied from the first word line WbL1 to the second impurity diffusion layers 11 and 12.

In addition, a description will be made assuming that the second gate insulation film 4 constituting the first capacitor 41a and the third gate insulation film 26 constituting the second capacitor 41b are continuously and integrally formed of the same material and arranged to be adjacent to each other, and similarly, the second gate electrode 6 constituting the first capacitor 41a and the third gate electrode 27 constituting the second capacitor 41b are continuously and integrally formed of the same material and arranged to be adjacent to each other. In addition, as shown in FIG. 2A, the second impurity diffusion layer 11 or 12 and the third impurity diffusion layer 3 having the conductivity type different from that of the second impurity diffusion layer are adjacently formed and a p-n junction is formed there.

Furthermore, the MOS capacitor 41 comprise a second conductivity type of high-concentration impurity diffusion layer 13 formed separately from the second impurity diffusion layer 12 through the element separating insulation film 32, on the third impurity diffusion layer 3. The MOS capacitor 41 also comprises the contact 24 electrically connected to the high-concentration impurity diffusion layer 13, so that a voltage can be applied from the second word line WaL1 to the high-concentration impurity diffusion layer 13. In addition, since the high-concentration impurity diffusion layer 13 and the third impurity diffusion layer 3 have the same second conductivity type, a voltage applied from the second word line WaL1 through the contact 24 is applied to the high-concentration impurity diffusion layer 13 and the third impurity diffusion layer 3. In addition, although the second impurity diffusion layer 12 and the high-concentration impurity diffusion layer 13 are separated by the element separating insulation film 32 in the constitution shown in FIG. 2, the element separating insulation film is not always needed and an embodiment in which the element separating insulation film 32 is not formed will be also described below (refer to FIG. 9).

As described above, according to the memory cell of the present invention, the second gate electrode 6, the second gate insulation film 4 formed under this layer, and the second impurity diffusion layer 11 (12) formed under this layer constitute the first capacitor 41a. At this time, strictly speaking, the overlapping part between the second gate electrode 6 and the second impurity diffusion layer 11 (12) constitutes the first capacitor 41a. Similarly, the third gate electrode 27, the third gate insulation film 26 formed under this layer, and the third impurity diffusion layer 3 formed under this layer constitute the second capacitor 41b. Strictly speaking, the overlapping part between the third gate electrode 27 and the third impurity diffusion layer 3 constitutes the second capacitor 41b (the region of the third impurity diffusion layer 3 overlapping with the third gate electrode 27 is referred to as the "second channel region 17" hereinafter). At this time, when the overlapping area between the second impurity diffusion layer 11 (12) and the second gate electrode 6 forming the first capacitor 41a (area of the first capacitor 41a) is almost the same as the overlapping area between the third impurity diffusion layer 3 and the second gate electrode 27 forming the second capacitor 41b or more, the effect of the present invention can be satisfactorily provided as will be described below and when the area of the first capacitor 41a is largely ensured, the effect can be more satisfactorily provided.

The first gate electrode 7, the second gate electrode 6, and the third gate electrode 27 are electrically connected to each other by the conductor 8. In addition, the first gate electrode 7 and the second gate electrode 6 may be integrally formed of the same conductive material, and the third gate electrode 27 may be also integrally formed with those electrodes as described above. In this case, the first gate electrode 7, the second gate electrode 6, the third gate electrode 27, and the conductor 8 are formed at the same time in the process of forming those conductive materials.

Figure 13A:
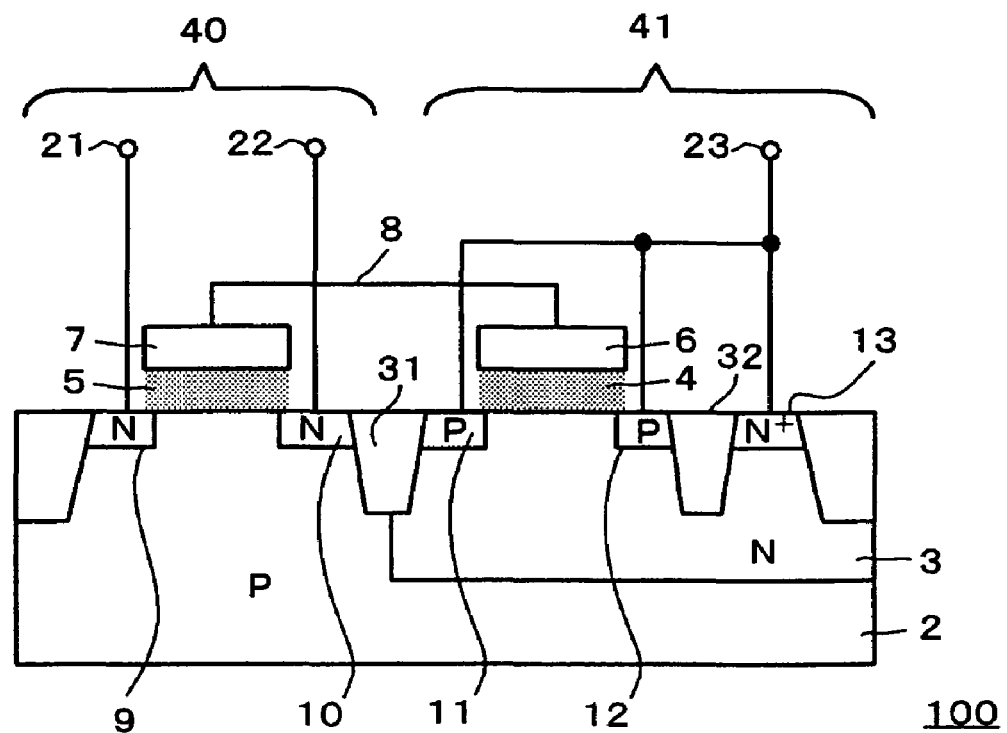
FIG. 13 is a constitution view showing a memory cell provided in a conventional nonvolatile semiconductor memory device.
Figure 13B:
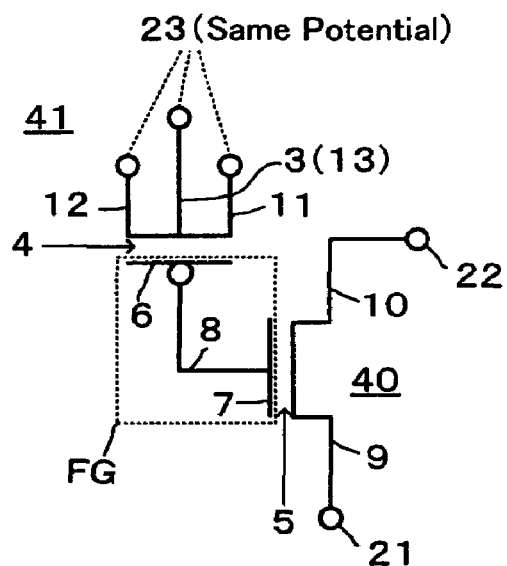

At this time, the memory cell 1 constitutes a nonvolatile memory cell in which the first gate electrode 7, the second gate electrode 6 (containing the third gate electrode 27) and the conductor 8 constitutes a floating gate electrodes FG, and the second impurity diffusion layers 11 and 12 and the third impurity diffusion layer 3 constitutes a control gate electrodes CG similar to the memory cell 100 shown in FIG. 13. A description will be made of a case where each action of programming, reading and erasing is performed in the above nonvolatile memory cell 1 hereinafter. In addition, since the programming process and the reading process are almost the same as those described in the section of the background of the invention, their description will be simplified. In addition, the description will be made assuming that the first conductivity type is a P-type and the second conductivity type is an N-type. That is, in this case, the MOS transistor 40 is an N channel type and the MOS capacitor 41 is a P channel type. In addition, one electrode constituting the first capacitor 41a is the P-type second impurity diffusion layer 11 (12) (the other electrode is the second gate electrode 6), and one electrode constituting the second capacitor 41b is the N-type third impurity diffusion layer 26 (the other electrode is the third gate electrode 27).

In addition, since the voltage applied to the second impurity diffusion layers 11 and 12 and the voltage applied to the high-concentration impurity diffusion layer 13 and the third impurity diffusion layer 3 can be different in the constitution of the memory cell 1 shown in FIG. 2, a description will be made assuming that the control gate electrode CG comprises a first control gate electrode CG1 comprising the second impurity diffusion layers 11 and 12, and a second control gate electrode CG2 comprising the third impurity diffusion layer 3 and the high-concentration impurity diffusion layer 13.

When the information is programmed in the memory cell 1, a predetermined first positive voltage is applied to the first impurity diffusion layer 9 through the contact 21, the ground voltage is applied to the first impurity diffusion layer 10 through the contact 22, a predetermined second positive voltage higher than the first positive voltage is applied to the second impurity diffusion layers 11 and 12 through the contact 25 and to the third impurity diffusion layer 3 through the high-concentration impurity diffusion layer 13 (referred to as "to the third impurity diffusion layer 3" simply hereinafter) from the contact 24 (this voltage applying condition is referred to as the "first voltage state" (corresponding to the "first voltage state" in the section of the background of the invention hereinafter). At this time, as described above, since the inversion layer is formed at the interface (that is, the first channel region 16) between the overlapping part of the first gate electrode 7 and the semiconductor substrate 2 and the first gate insulation film 5 as described above, the MOS transistor 40 becomes a conductive state and receives the effect of the electric field generated in the direction from the first impurity diffusion layer 9 to the first impurity diffusion layer 10, and an electron in the first impurity diffusion layer 10 is accelerated and becomes a hot electron. Thus, the hot electron is drawn by the positive high voltage of the first gate electrode 7 and injected into the floating gate electrode FG. Thus, the floating gate electrode FG is negatively charged. Therefore, when the state in which the electrons are sufficiently accumulated in the floating gate electrode FG and the floating gate electrode FG is negatively charged is set as a programming state and the opposite state is set as a non-programming state, the memory cell 1 selected by the above first voltage state is programmed.

Meanwhile, when the information programmed in the memory cell 1 is read, the fourth positive voltage is applied to the first impurity diffusion layer 9 through the contact 21, the ground voltage is applied to the first impurity diffusion layer 10 through the contact 22, the third positive voltage is applied to the second impurity diffusion layers 11 and 12 through the contact 25 and to the third impurity diffusion layer 3 through the contact 24 (this voltage applying condition is referred to as the "second voltage state" (corresponding to the "second voltage state" in the section of the background of the invention), hereinafter). Thus, it is determined whether a current flowing in the bit line BL1 connected to the contact 21 or a current flowing in the source line SL1 connected to the contact 22 is detected in the second voltage state or not, and the information of the memory cell 100 is read by relating the determined result to two values of 0 and 1. More specifically, when the floating gate electrode FG is sufficiently negatively charged, that is, when the information is programmed in the memory cell 1, since the inversion layer (transistor side inversion layer) is not formed in the first channel region 16 under the second voltage state, the MOS transistor 40 is in a non-conductive state, so that a current is not detected in the bit line BL1 or the source line SL1. Meanwhile, when the floating gate electrode FG is not sufficiently charged, that is, when the information is not programmed in the memory cell 1, since the inversion layer (the transistor side inversion layer) is formed in the first channel region 16 under the second voltage state, the MOS transistor 40 becomes the conductive state, so that a current is detected in the bit line BL1 or the source line SL1. More specifically, the information of the target memory cell 1 can be read by relating the current detection result of the bit line BL1 or the source line SL1 connected to the memory cell to be read, to two values 0 and 1 after the memory cell 1 to be read is brought into the second voltage state.

Next, a description will be made of a case the information programmed in the memory cell 1 is erased. In this case, the fifth positive voltage (about the same as the first positive voltage or more and referred to as the "first erasing voltage" occasionally hereinafter) is applied to the first impurity diffusion layer 9 through the contact 21, the contact 22 is brought into the floating state, a predetermined sixth negative voltage (negative high voltage that is referred to as the "second erasing voltage" occasionally hereinafter) is applied to the second impurity diffusion layers 11 and 12 through the contact 25, and the ground voltage (referred to as the "third erasing voltage" occasionally hereinafter) is applied to the third impurity diffusion layer 3 through the contact 24 (this voltage applying condition is referred to as the "fourth voltage state" hereinafter).

When the ground voltage (third erasing voltage) is applied from the contact 24, the third impurity diffusion layer 3 becomes the ground potential. At this time, when the floating gate electrode FG is sufficiently negatively charged and has a sufficiently high threshold voltage (in a programming state), the second channel region 17 becomes a strong inversion condition, so that an inversion layer is formed there. In this case, a minority-carrier hole is injected from the second impurity diffusion layer 11 (12) in the first capacitor 41a and the sixth negative voltage (second erasing voltage) of the second impurity diffusion layer 11 (12) is transmitted to the second channel region 17. Thus, in addition to the first capacitor 41a to which the sixth negative voltage (second erasing voltage) is directly applied from the contact 25, the sixth negative voltage (second erasing voltage) is also capacitive-coupled in the second capacitor 41b that is adjacent to the first capacitor 41a. Thus, according to the characteristics of the present invention in which the different voltages (first erasing voltage and second erasing voltage) can be applied to the first control gate electrode CG1 and the second control gate electrode CG2, respectively, the negative voltage can be capacitive-coupled in the floating electrode FG at the time of erasing action.

However, unlike the case where the positive voltage is applied to the third impurity diffusion layer 3 in the second voltage state at the time of reading action, since the third impurity diffusion layer 3 is at the ground potential at the time of erasing, as the erasing proceeds and the negative charge of the floating gate electrode FG is eliminated and the threshold voltage of the memory cell is lowered, the potential difference between the floating gate electrode FG and the second channel region 17 becomes small, so that the second channel region 17 becomes a weak inversion state depending on the threshold voltage of the memory cell and cannot maintain the strong inversion state in some cases. At this time, the most part of second channel region 17 becomes the potential between the floating gate electrode FG and the third impurity diffusion layer 3, whereby the capacitive coupling of the potential of the floating electrode FG to the sixth negative voltage (second erasing voltage) deteriorates.

Meanwhile, although the interface between the second impurity diffusion layer 11 (12) that overlaps with the second gate electrode 6 and constitutes the first capacitor 41a and the second gate insulation film 4 becomes the inversion state by the application of the sixth negative voltage (second erasing voltage), since the impurity density of the second impurity diffusion layer 11 (12) is high enough, the second gate electrode 6 is capacitive coupled at almost the same voltage as the sixth negative voltage (second erasing voltage) applied to the second impurity diffusion layers 11 and 12 through the contact 25. Therefore, when the area of the first capacitor 41a, that is, the overlapping area between the second gate electrode 6 and the second impurity diffusion layer 11 (12) is sufficiently ensured, the sixth negative voltage can be capacitive-coupled to the floating electrode FG through the first capacitor 41a at the time of erasing action. The capacitive coupling by the first capacitor 41a is not changed by the potential of the floating electrode FG like the above second capacitor 41b.

Thus, the sixth negative voltage (second erasing voltage) applied to the first control gate electrode CG1 is capacitive-coupled to the floating electrode FG by the first capacitor 41a and the second capacitor 41b.

In addition, when the junction part between the second impurity diffusion layer 11 (12) and the third impurity diffusion layer 3 that is the contact point of the potential of the first control gate electrode CG1 and the potential of the second control gate electrode CG2 is formed through an impurity diffusion layer having at least one of the conductivity types of the second impurity diffusion layer 11 (12) and the third impurity diffusion layer 3 and having an impurity density of less than $1\times10^{19}$ ions/cm$^3$ (the third impurity diffusion layer 3 is illustrated as the N-type well in the embodiment shown in FIG. 2A), junction withstand voltage is prevented from being lowered due to zener breakdown at the diffusion junction between the second impurity diffusion layer 11 (12) and the third impurity diffusion layer having a high impurity density, and the junction withstand voltage between the potential of the first control gate CG1 and the potential of the second control gate electrode CG2 can be improved. As a result, the absolute value of the sixth negative voltage (second erasing voltage) that can be applied to the second impurity diffusion layer 11 (12) of the first control gate electrode CG1 can be high, so that the erasing action can be performed at high speed.

Here, when it is assumed that the area of the overlapping region between the second gate electrode 6 and the second impurity diffusion layer 11 (12) (that is, the area of the first capacitor 41a) is Acgp, the overlapping region between the third gate electrode 27 and the third impurity diffusion layer 3 (that is, the area of the second capacitor 41b) is Acgn, and the overlapping area between the first gate electrode 7 and the first channel region 16 is Arg, a capacity coupling ratio Rcgp of the second gate electrode 6 to the second impurity diffusion layer 11 (12) and a capacity coupling ratio Rcgn of the second gate electrode 6 to the inversion layer formed in the second channel region 17 are expressed by the following formulas (1) and (2), whereby the potential of the second gate electrode 6, that is, a potential Vfg of the floating gate electrode FG at the time of erasing action is expressed by the following formula (3).

$$Rcgp=Acgp/(Acgp+Acgn+Arg) \quad (1)$$

$$Rcgn=Acgn/(Acgp+Acgn+Arg) \quad (2)$$

$$Vfg=Rcgp\times Vers+k\times Rcgn\times Vers \quad (3)$$

Here, in the formula (3), reference "Vers" designates the sixth negative voltage (second erasing voltage) applied to the second impurity diffusion layer 11 (12), reference "k" designates a coefficient showing a potential drop from an adjacent diffusion layer in the inversion layer and varies according to the strength of the inversion layer and falls within a range of 0<k<1. In addition, since the capacitive coupling between the first impurity diffusion layer 9 and the first gate electrode 7 is considerably small as compared with other capacitive couplings, it is omitted, and it is assumed that the thickness of the first gate insulation film 5 and the thickness of the second gate insulation film 4 are the same in the above formulas.

As described above, since the third impurity diffusion layer 3, that is, the second channel region 17 is at the ground potential at the time of erasing, when the potential difference between the floating gate electrode FG and the second channel region 17 is less than the threshold voltage to form the inversion layer, the inversion layer is not formed on the second channel region 17, so that in this case, the second gate electrode 6 is capacitive-coupled to the ground potential. At this time, the above coefficient "k" is close to 0 infinitely. In addition, even in the case the charged potential of the second gate electrode 6 satisfies the threshold voltage to form the inversion layer, when it stays around the threshold voltage, since the formed inversion layer is in the weak inversion condition as described above, a sufficient inversion layer carrier density cannot be provided and the coefficient "k" is less than 0.5. Meanwhile, when the potential difference between the floating gate electrode FG and the second channel region 17 is sufficiently higher than the threshold voltage to form the inversion layer, that is, when the charged potential of the second gate electrode 6 is sufficiently high, the formed inversion layer is in the strong inversion state, so that the coefficient "k" is sufficiently high in the above range. That is, the term (k×Rcgn×Vers) that is affected by the potential of the surface of the second channel region 17 varies depending on the charged state of the second gate electrode 6, and especially, when the memory cell threshold voltage is lowered due to the erasing action, contribution of this term is lowered. Meanwhile, the term (Rcgp×Vers) in the overlapping region between the second gate electrode 6 and the second impurity diffusion layer 11 (12) can be stably capacitive-coupled to the second gate electrode without being affected by the adjacent diffusion layer (the coefficient "k" is not contained).

According to the above formulas, when the term (Rcgp×Vers) is increased in the erasing action of the memory cell in the present invention, the sixth negative voltage applied at the time of erasing can be capacitive-coupled to the floating gate electrode FG stably and effectively, whereby the cancel ability of the charged state in the floating gate electrode FG, that is, the erasing ability can be enhanced. In this case, there is a method to increase Rcgp (a capacity coupling ratio of the second gate electrode 6 to the second impurity diffusion layer 11 (12)) in the term (Rcgp×Vers) and a method to increase the absolute value of Vers (the sixth negative voltage (second erasing voltage) applied to the second impurity diffusion layer 11 (12)). In the case of the method to increase the Rcgp, Acgp (area of the first capacitor 41a, that is, the area of the overlapping region between the second gate electrode 6 and the second impurity diffusion layer 11 (12)) is to be increased according to the formula (1), so that when the area of the first capacitor 41a is increased, the erasing action of the memory cell in the present invention can be performed with high efficiency.

However, as described above, at the time of reading/programming action in which the positive voltage is applied to the first control gate electrode CG1 and the second control gate electrode CG2, the surface of the third impurity diffusion layer 3 (second channel region 17) formed under the third gate electrode 27 that becomes a part of the floating gate FG becomes the inversion state. At this time, since it is necessary to supply a minority carrier hole of the inversion layer, it is necessary to arrange the second impurity diffusion layer 11 (12) in at least one part of the region under the second gate electrode 6 that is the adjacent region of the third impurity diffusion layer 3.

In addition, in the case where both impurity densities of the second impurity diffusion layer 11 (12) and the third impurity diffusion layer 3 are not less than $1\times10^{19}$ ions/cm$^3$, when they are connected thorough the impurity diffusion layer having at least one of the conductivity types of the second impurity diffusion layer 11 (12) and the third impurity diffusion layer 3 and having an impurity density of less than $1\times10^{19}$ ions/cm$^3$ and electrically connected to one of them, the applicable voltage between the first control gate electrode CG1 connected to the second impurity diffusion layer 11 (12) and the second control gate electrode CG2 connected to the third impurity diffusion layer 3 can be increased. The reason will be described below.

The relation between an impurity density and a junction breakdown voltage in a one-sided abrupt junction is disclosed in "S. M. Sze, Physics of Semiconductor Devices 2$^{nd}$ Edition, p 104, 1981. Willey". According to the above document, as the impurity density is increased, the junction breakdown voltage is lowered. Especially, the breakdown phenomenon in a region having a high impurity density is called the zener breakdown and when the impurity density is not less than $1\times10^{19}$ ions/cm$^3$, the above junction breakdown voltage is less than 1V in general in a case of silicon, which is very low.

Therefore, when both impurity densities of the second impurity diffusion layer 11 (12) and the third impurity diffusion layer 3 are not less than $1\times10^{19}$ ions/cm$^3$, the junction breakdown voltage between the impurity diffusion layers is less than 1V. At this time, since the third impurity diffusion layer 3 is at the ground potential at the time of erasing action as described above, the sixth negative voltage whose absolute value exceeds 1V cannot be applied to the second impurity diffusion layer 11 (12). In addition, as will be described below, when the third erasing voltage applied to the third impurity diffusion layer 3 is a positive voltage at the time of erasing action, it is further difficult to apply the sixth negative voltage whose absolute value exceeds 1V to the second impurity diffusion layer 11 (12).

Meanwhile, when the impurity density of at least one of both impurity diffusion layers is less than $1\times10^{19}$ ions/cm$^3$, when not more than $1\times10^{17}$ ions/cm$^3$, especially, the junction breakdown voltage becomes a high value exceeding 10V. Therefore, in this case, the sixth negative voltage (second erasing voltage) whose absolute value exceeds 10V can be applied to the second impurity diffusion layer 11 (12). That is, when the case where both impurity densities of the second impurity diffusion layer 11 (12) and the third impurity diffusion layer 3 are not less than $1\times10^{19}$ ions/cm$^3$ is compared with the case where the impurity density of at least one of them is less than $1\times10^{19}$ ions/cm$^3$, the applicable sixth negative voltage has a difference of more than 10 times.

As described above, the potential Vfg of the floating gate electrode FG affecting the erasing speed at the time of erasing action is calculated by the formula (3). In addition, the sixth negative voltage (second erasing voltage) corresponds to Vers in the formula (3). Therefore, when the term Rcgp×Vers in the formula (3) is calculated in the case where both impurity densities of the second impurity diffusion layer 11 (12) and the third impurity diffusion layer 3 are not less than $1\times10^{19}$ ions/cm$^3$ and in the case where the impurity density of at least one conductivity type of impurity diffusion layer is less than $1\times10^{19}$ ions/cm$^3$ and compared with each other, the difference between them is more than ten times due to the difference in value of Vers.

Thus, when the second impurity diffusion layer 11 (12) and the third impurity diffusion layer 3 are connected through the impurity diffusion layer having at least one of the conductivity types of the second impurity diffusion layer 11 (12) and the third impurity diffusion layer 3 and having the impurity density of less than $1\times10^{19}$ ions/cm$^3$, the junction withstand voltage of the second impurity diffusion layer to the third impurity diffusion layer is increased, whereby the absolute value of the sixth negative voltage (second erasing voltage) that can be applied to the second impurity diffusion layer 11 (12) can be increased, so that the erasing action of the memory cell in the present invention can be performed at higher efficiency.

Thus, the potential of the second gate electrode 6 can be a high negative potential state by the capacitive coupling by the potential of the first control gate electrode CG1 and the potential of the second control gate electrode CG2. At this time, since the fifth positive voltage (first erasing voltage) is applied to the first impurity diffusion layer 9 from the contact 21, a high potential difference is generated between the first impurity diffusion layer 9 and the first gate electrode 7. At this time, a hot hole generated by the above-described band-to-band tunneling induced hot hole injection is injected in the floating gate electrode FG, and the negative charged state is canceled and the information is erased.

Figure 3:
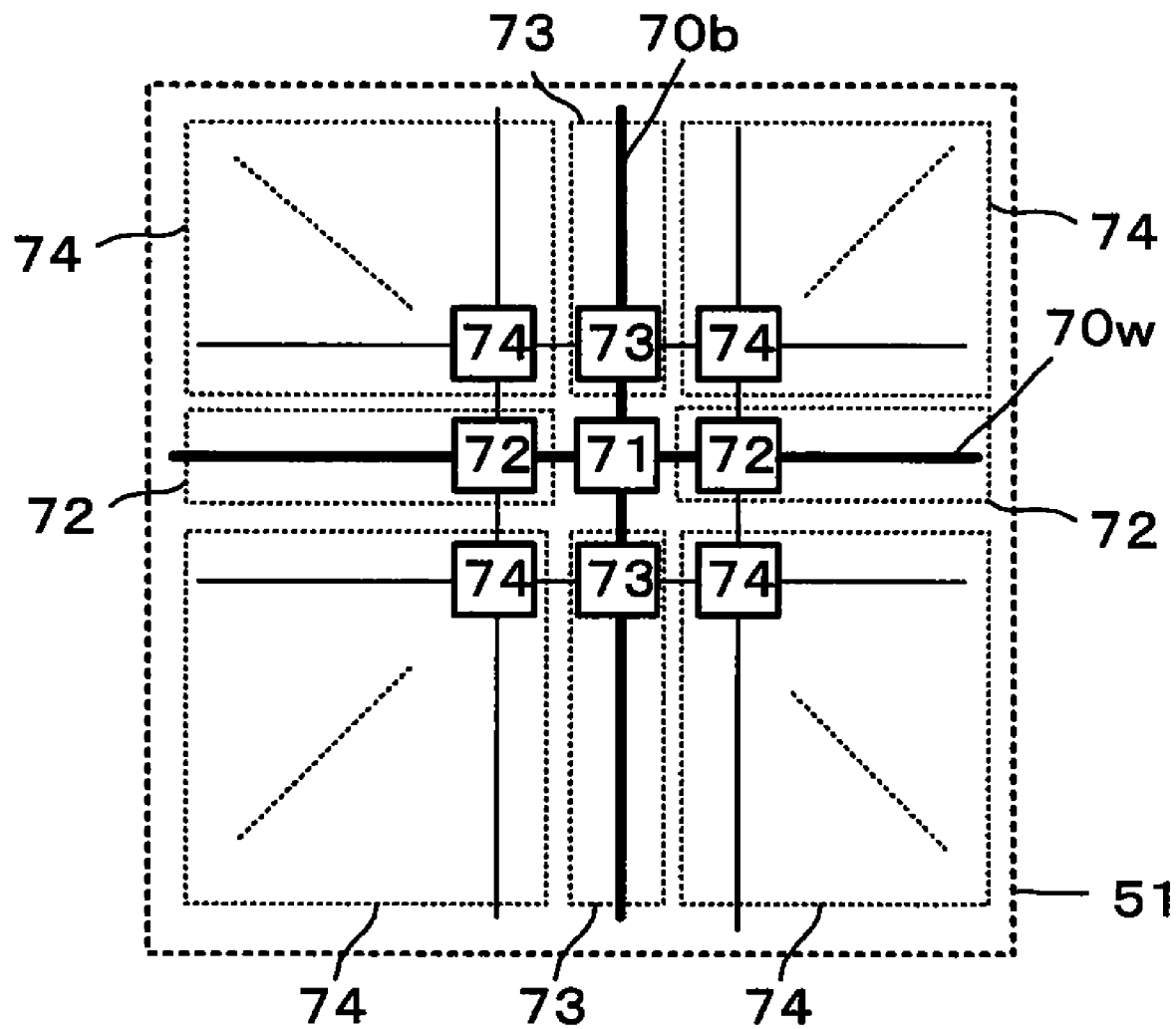
FIG. 3 is a graph showing a relation between an overlap rate and a ratio of the positive and negative capacitive couplings.

A voltage applying process in the whole memory cell array when each process of programming, reading and erasing is performed in the selected memory cell will be described. FIG. 3 is a conceptual view of the memory cell array 51.

In FIG. 3, it is assumed that a memory cell 71 is a selected memory cell to be processed. In this case, memory cells 73 existing in the same column as the memory cell 71 are connected to the same bit line 70b and memory cells 72 existing in the same row as the memory cell 71 are connected to the same word line 70w (strictly speaking, a first word line and a second word line).

When a certain process is performed on the selected memory cell 71, a voltage corresponding to the process is applied to the bit line 70b and the word line 70w connected to the selected memory cell 71. At this time, the same voltage as the voltage applied to the bit line 70b is applied to the connecting points between the bit line 70b and the memory cells 73 connected to the bit line 70b and similarly, the same voltage as the voltage applied to the bit line 70w is applied to the connecting points between the word line 70w and the memory cells 72 connected to the word line 70w. In addition, the voltage applied to the bit line 70b or the voltage applied to the word line 70w is not applied to memory cells 74 that are not connected to the column or the row connected to the selected memory cell 71.

Thus, there is a difference in voltage applying condition among the memory cells other than the selected memory cell 71 (referred to as the "unselected memory cells" hereinafter) depending their arranged position. Hereinafter, it is to be noted that the unselected memory cells 73 existing in the same column as the selected memory cell 71 are referred to as the first unselected memory cells, the unselected memory cells 72 existing in the same row as the selected memory cell 71 are referred to as the second unselected memory cells, and the memory cells 74 not existing in the same row or same column as the selected memory cell 71 are referred to as the third unselected memory cells.

FIG. 4 is a table showing voltages applied to the selected memory cell and the first to third unselected memory cells when the programming, reading and erasing actions are performed in the selected memory cell. In addition, in FIG. 4, reference character Vb designates the voltage applied to the bit line connected to the memory cell, reference character Vs designates the voltage applied to the source line, reference character Vwa designates the voltage applied to the second word line, and reference character Vwb designates the voltage applied to the first word line.

When information is programmed in the memory cell 1 shown in FIG. 1, for example, a voltage (first positive voltage) of about 4 to 12V is applied to the bit line BL1 connected to the memory cell 1, and a voltage (second positive voltage) of about 12 to 16V is applied to both first word line WbL1 and second word line WaL1. In addition, other bit lines, first word lines, second word lines, and all the source lines are set at the ground potential. In addition, the same reference number as that of each component in the schematic view of the memory cell 1 in FIG. 2 is used for the same component of another memory cell in the following description for easy understanding.

When the voltage is applied as described above (the first voltage state), the information is programmed in the memory cell 1 as described above. Meanwhile, as for the first unselected memory cells, for example, since an inversion layer is not formed in the second channel region 17 and the potential of the floating gate electrode FG does not rise, an inversion layer is not formed in the first channel region 16, so that a hot electron is not generated and the information is not programmed. In addition, as for the second unselected memory cells, since an electric field is not generated between the first impurity diffusion layers 9 and 10 sandwiching the first channel region 16, a hot electron is not generated and the information is not programmed. As for the third unselected memory cells, the information is not programmed for the same reason. That is, the information is programmed only in the selected memory cell in the above voltage applying condition.

In addition, when the information of the memory cell 1 is read, a voltage (fourth positive voltage) of about 1V is applied to the bit line BL1 connected to the memory cell 1, and a voltage (third positive voltage) of about 1.8 to 5V is applied to both first word line WbL1 and second word line WaL1. In addition, other bit lines, first word lines, second word lines and all the source lines are set at the ground potential.

When the voltage is applied as described above (the second voltage state), the information is read from the memory cell 1 as described above. Meanwhile, as for the first unselected memory cells, since the inversion layer is not formed in the second channel region 17, so that the information is not read by mistake, as for the second unselected memory cells, since there is no potential difference between the separately formed first impurity diffusion layers 9 and 10, the information is not read by mistake, and as for the third unselected memory cells, the information is not read for the same reason. That is, the information is read only from the selected memory cell in the above voltage applying condition.

In addition, when the information of the memory cell 1 is erased, a voltage (fifth positive voltage (first erasing voltage)) of about 4 to 16V is applied to the bit line BL1 connected to the memory cell 1, a voltage (sixth negative voltage (second erasing voltage)) of about −12 to −16V is applied to the first word line WbL1, and the ground voltage (third erasing voltage) is applied to the second word line WaL1. In addition, the source line SL1 is set in a floating state. Other bit lines, first word lines, second word lines and source lines are set at the ground voltage.

When the voltage is applied as described above (the fourth voltage state), the information is erased from the memory cell 1 as described above. Meanwhile, as for the first unselected memory cells, since the second channel region 17 becomes a weak inversion state or the inversion layer is not formed there and the potential difference between the first impurity diffusion layer 9 and the floating gate electrode FG is not sufficient to generate the hot hole, so that the information is not erased by mistake, as for the second unselected memory cells, since a positive voltage is not applied to the first impurity diffusion layer 9, the potential difference from the floating gate electrode is small and the hot hole is not generated, so that the information is not erased by mistake, and as for the third unselected memory cells, the information is not erased by mistake for the same reason. That is, the information is erased only from the selected memory cell in the above voltage applying condition.

Figure 5:
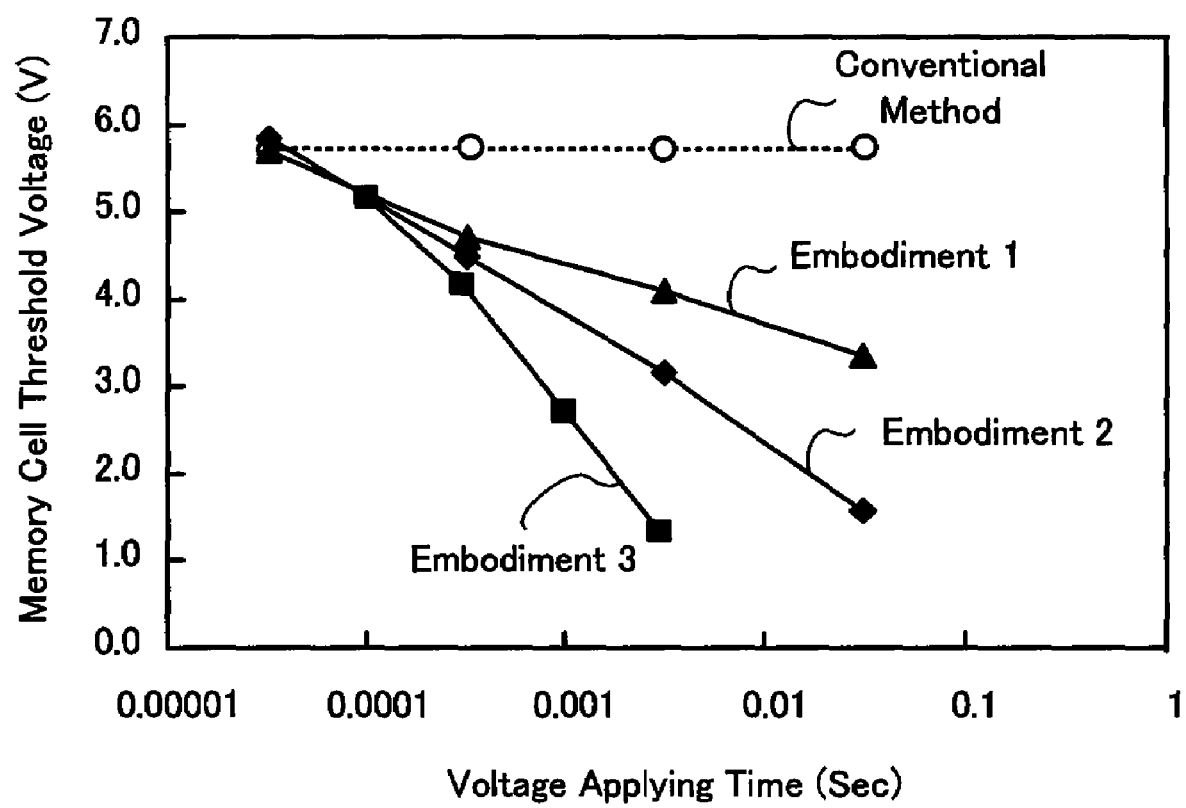
FIG. 5 is a table showing a voltage applying condition in each memory cell when each process is performed on the selected memory cell.

FIG. 5 is a graph in which the erasing ability of embodiments (embodiments 1 to 3) having different constitution conditions of the memory cell 1 in FIG. 2 and the memory cell 100 having the conventional constitution shown in FIG. 13 are compared, and the horizontal axis designates a voltage applying time when a predetermined erasing voltage is applied and the vertical axis designates the memory cell threshold voltage.

In any one of the embodiments 1 to 3 and the memory cell 100 having the conventional constitution, the first gate insulation film 4 and the second gate insulation film 5 have a thickness of 44 nm. In addition, in the embodiments 1 to 3, the ratio between the capacitor area of the first capacitor 41a that is the overlapping area of the second impurity diffusion layer 11 (12) and the second gate electrode 6 (referred to as the "first capacitor area" hereinafter), and the capacitor area of the second capacitor 41b that is the overlapping area of the third impurity diffusion layer 3 and the third gate electrode 27 (referred to as the "second capacitor area" hereinafter) is changed such that the first capacitor area is four times as large as the second capacitor area in the first embodiment, the first capacitor area is almost equal to the second capacitor area in the second embodiment, and the ratio between the first capacitor area and the second capacitor area is equal to that of the memory cell 100 having the conventional constitution in the embodiment 3.

In addition, according to the embodiments 1 and 2, the memory cell is implemented so as to satisfy each condition by defining the second impurity diffusion layer 11 (12) as an ion implantation region with a mask pattern of a photoresist.

In addition, according to the memory cell 100 having the conventional constitution, the overlapping area between the second impurity diffusion layer 11 (12) and the second gate electrode 6 has the same structure of the MOS transistor of the general logic circuit. According to the MOS transistor structure of the general logic circuit, since the overlapping part between the source diffusion region or drain diffusion region and the gate electrode is a parasitic region to be reduced for miniaturizing the MOS transistor by reducing its ineffective gate length or increasing an operation speed by reducing a parasitic capacity of that region, it is reduced to a small range so that its effect can be neglected, and the first capacitor area is about 30% of the second capacitor area.

The memory cell 1 of the present invention (embodiments 1 to 3) is in the voltage applying condition such that a voltage of −14V is applied from the contact 25 to the second impurity diffusion layer 11 (12), the ground voltage is applied from the contact 24 to the third impurity diffusion layer 3 through the high-concentration impurity diffusion layer 13, a voltage of 15V is applied from the contact 21 to the first impurity diffusion layer 9, and the contact 22 is set in a floating state. Meanwhile, the memory cell 100 having the conventional constitution is in the voltage applying condition such that the ground voltage is applied from the contact 23 to the second impurity diffusion layer 11 (12) and to the third impurity diffusion layer 3 through the high-concentration impurity diffusion layer 13, a voltage of 15V is applied from the contact 21 to the first impurity diffusion layer 9, and the contact 22 is set in a floating state. More specifically, according to the comparison between the memory cell 1 of the present invention in the third embodiment and the memory cell 100 of the conventional example, the same voltage is applied to the first impurity diffusion layers 9 and 10 and the third impurity diffusion layer 3 and the high-concentration impurity diffusion layer 13, and only the voltage applied to the second impurity diffusion layer 11 (12) is changed. According to the comparison between the memory cells according to the first, second and third embodiments, only the ratio of the first capacitor area to the second capacitor area is changed.

As shown in FIG. 5, the threshold voltage of the memory cell 1 in the embodiment 3 is largely reduced with time as compared with the memory cell 100 having the conventional constitution, which means the memory cell 1 of the present invention has a high level of ability to eliminate the charged state in the floating gate electrode FG, that is, has an extremely high level of erasing ability because the negative voltage can be applied to the second impurity diffusion layer 11 as compared with the memory cell 100 having the conventional constitution.

In addition, as for the memory cell in the embodiment 3 of the present invention shown in FIG. 5, although the threshold voltage is reduced with time, the amount of the change of the threshold voltage (referred to as the "erasing speed" hereinafter) deteriorates with time. Meanwhile, as for the memory cell in the embodiment 1 or the embodiment 2 in which the first capacitor area is sufficiently larger than the second capacitor area, the threshold voltage is largely reduced with time without deteriorating its erasing speed.

As for the second capacitor 41b in the embodiment 3, as the erasing action proceeds and the negative charge of the floating gate electrode FG is eliminated and the threshold voltage of the memory cell is lowered, the potential difference between the floating gate electrode FG and the second channel region 17 becomes small and the second channel region 17 becomes the weak inversion condition and cannot maintain the high inversion condition. At this time, since most part of the second channel region 17 is at the potential between the potential of the floating gate electrode FG and the potential of the third impurity diffusion layer 3, the conductive coupling of the potential of the floating gate electrode FG to the negative voltage deteriorates and the erasing speed is lowered. Meanwhile, according to the embodiment 1 or the embodiment 2 of the memory cell of the present invention formed such that the first capacitor area is almost the same as the second capacitor area or more, since the capacitance of the first capacitor 41a is stably ensured against the potential fluctuation of the floating gate electrode FG, even when the capacitive coupling of the second capacitor 41b deteriorates for the above reason, the capacitive coupling between the first control gate electrode CG 1 and the floating gate electrode FG is maintained, so that the erasing speed is prevented from being reduced. Furthermore, it can be seen that the erasing speed is increased in the embodiment 1 because the first capacitor area is larger than the second capacitor area as compared with the embodiment 2 of the memory cell of the present invention.

Thus, since the memory cell 1 of the present invention is so constituted that the negative voltage can be applied to the second impurity diffusion layer 11 (12), the ability to eliminate the charged state in the floating gate electrode FG, that is, the erasing ability can be improved as compared with the memory cell 100 having the conventional constitution. Thus, within the range in which the second impurity diffusion layer 11 (12) is in contact with the third impurity diffusion layer 3 and they form a junction under the second gate electrode 6 and the second gate insulation film 4, or under the third gate electrode 27 and the third insulation film 26, as the first capacitor area (the overlapping area between the second impurity diffusion layer 11 (12) and the second gate electrode 6) is increased, the erasing ability of the memory cell can be improved.

In addition, although the third erasing voltage applied to the third impurity diffusion layer 3 from the contact 24 is the ground voltage in the erasing action of the information programmed in the memory cell 1 in the above, it may be the voltage having the same polarity as the first erasing voltage (positive polarity voltage in the above embodiment) applied to the first impurity diffusion layer 9 from the contact 21.

As described above, when the third erasing voltage is set to the ground voltage, the third impurity diffusion layer 3 receiving the third erasing voltage is at the ground potential. At this time, when the third impurity diffusion layer 3 becomes lower than the ground voltage because the potential of the third impurity diffusion layer 3 fluctuates due to the noise and the like, a forward junction is constituted with the semiconductor substrate 2 and as a result, it is considered that the forward current could be generated between the semiconductor substrate 2 and the third impurity diffusion layer 3.

In addition, when the floating gate electrode FG comes close to the ground potential during the erasing action, since the ground voltage is applied to the third impurity diffusion layer 3, it is considered that the strong inversion condition on the surface of the third impurity diffusion layer 3 (second channel region 17) serving as the second control gate electrode CG2 cannot be maintained and as a result, the erasing speed could be reduced.

Here, during the erasing action, similar to the above case, the fifth positive voltage (first erasing voltage) is applied to the first impurity diffusion layer 9 through the contact 21, and the sixth negative voltage (second erasing voltage) is applied to the second impurity diffusion layers 11 and 12 through the contact 25, and furthermore, not the ground voltage but the positive voltage having the same polarity as the first erasing voltage is applied to the third impurity diffusion layer 3 from the contact 24 as the third erasing voltage.

In this case, since reverse junction is maintained between the third impurity diffusion layer 3 and the semiconductor substrate 2, even when the potential of the third impurity diffusion layer 3 fluctuates due to the noise and the like, sufficient resistance against the case where the forward connection is generated between the third impurity diffusion layer 3 and the semiconductor substrate 2 can be ensured.

In addition, when the third impurity diffusion layer 3 is set at the positive potential, the potential difference between the floating gate electrode FG and the second channel region 17 can be ensured by a positive voltage bias applied to the third impurity diffusion layer 3, against the reduction in potential difference between the floating gate electrode FG and the second channel region 17 due to the proceeding of the erasing. Thus, even when the negatively charged state of the floating gate electrode FG is eliminated, a necessary strong inversion condition can be ensured as compared with the case where the third impurity diffusion layer 3 is set to the ground potential. That is, the limited range in threshold voltage of the memory cell that can maintain the high erasing performance can be widened. Thus, the erasing ability and erasing speed can be further improved as compared with the case where the third erasing voltage is at the ground voltage based on the above formulas (1) to (3).

FIG. 6 shows the relation of the voltages to be applied to each bit line and each word line when the third erasing voltage is set to the positive voltage like FIG. 4.

That is, at the time of erasing action, a voltage fifth positive voltage (first erasing voltage)) of about 4 to 16V is applied to the bit line BL1 connected to the memory cell 1, and a voltage (sixth negative voltage (second erasing voltage)) of about −12 to −16V is applied to the first word line WbL1, and a positive voltage (third erasing voltage) of about 0.8V to 6V is applied to the second word line WaL1. In addition, the source line SL1 is set in a floating state. Thus, other bit lines, first word lines, second word lines, and source lines are set at the ground voltage.

Here, the third erasing voltage is optimized in view of the following points (1) to (4). That is, (1) the junction withstand voltage between the third impurity diffusion layer 3 and the second impurity diffusion layers 11 and 12 at the time of erasing action is not to exceed the total of the absolute voltage values of the first word line WbL1 and the second word line WaL1, (2) the voltage is high enough to maintain the reverse bias between the semiconductor substrate 2 and the third impurity diffusion layer 3 against an inflow noise, (3) the voltage is high enough to keep the second channel region 17 in the strong inversion condition within the threshold value of the driven memory cell, and (4) the conductive coupling for coupling the floating gate electrode FG to the positive voltage by the above positive voltage (third erasing voltage) via the capacitance between the third impurity diffusion layer 3 and the third gate electrode 27 is to be within a range in which the capacitive coupling for coupling the floating gate electrode FG to the negative voltage by the negative voltage (second erasing voltage) of the second impurity diffusion layers 11 and 12 is not canceled.

At this time, when the power supply voltage for the peripheral logic circuit can be employed as the set third erasing voltage, since an extra circuit for generating this positive voltage is omitted, it is preferable in view of reduction in size of the device.

Layout Example of Memory Cell of the Present Invention

Next, a layout constitution example of the memory cell of the present invention will be described with reference to FIGS. 7 to 11. FIGS. 7 to 11 each show one example of the schematic layout constitution on which the memory cell 1 of the present invention can be mounted.

Figure 7:
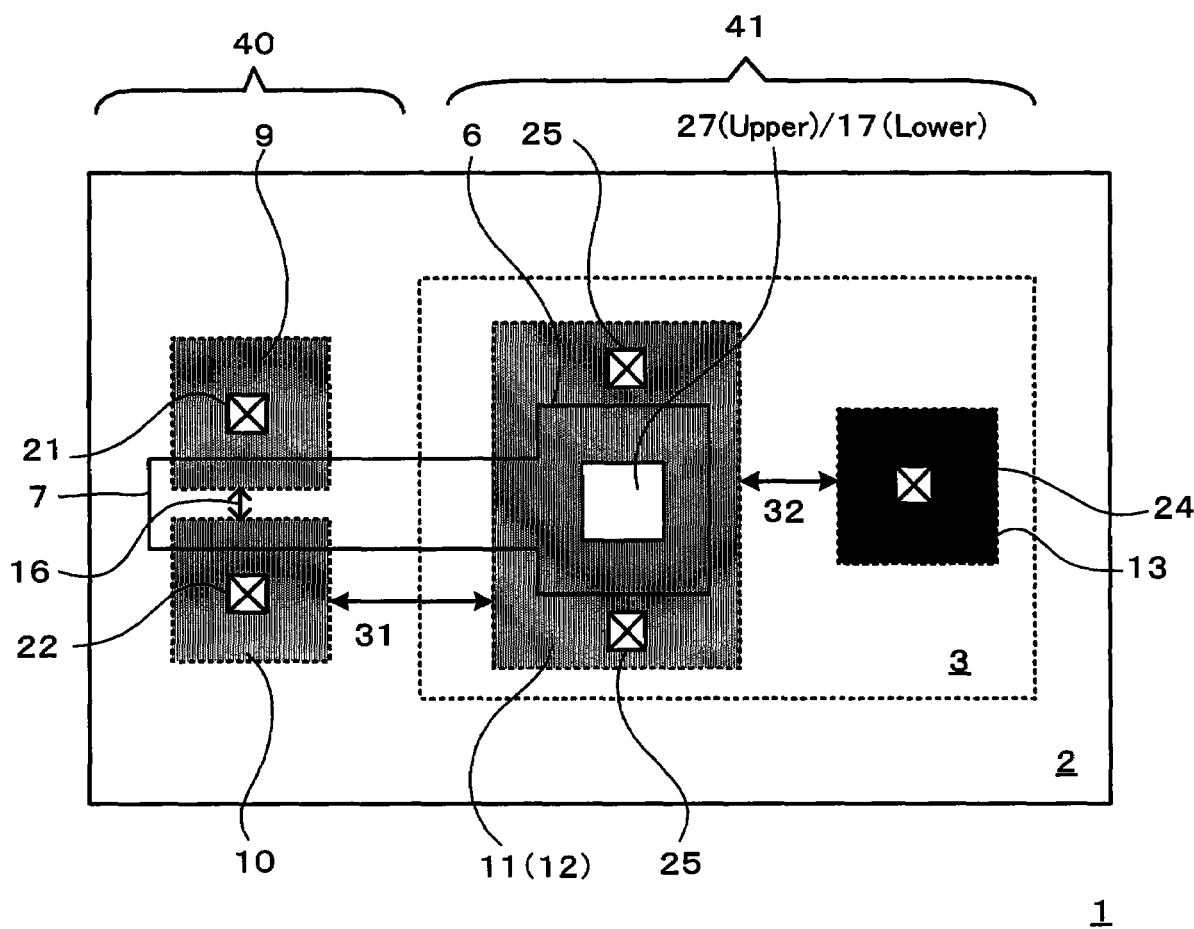
FIG. 7 is an example of a schematic view of a layout constitution in which a memory cell 1 of the present invention can be mounted.

According to the layout example shown in FIG. 7, the first gate electrode 7, the second gate electrode 6 and the third gate electrode 27 are integrally formed of the same material, and the second gate electrode 6 overlaps with the second impurity diffusion layer 11 (or 12) by diffusing an impurity from the periphery of the second gate electrode 6 to the lower direction of the second gate electrode 6 (that is, inner side), and the second channel region 17 is formed inside. In addition, a gate electrode positioned above the second channel region 17 corresponds to the third gate electrode 27.

As for the overlapping part between the second gate electrode 6 and the second impurity diffusion layer 11 (12), a first conductivity type of impurity is introduced onto the semiconductor substrate using the second gate electrode 6 as a mask, and then the impurity is diffused in the horizontal direction. Alternatively, an impurity is introduced using a photoresist as a mask instead of using the second gate electrode 6 as a mask in a manufacturing process before the gate electrode 6 is formed, or the gate electrode is formed with a photoresist as a mask and an impurity is introduced on the semiconductor substrate 1 by ion implantation with energy high enough so as not to be blocked by the gate electrode material but to be blocked by the photoresist. In addition, according to the latter methods of forming the impurity diffusion layer using the photoresist as a mask, the shape and area of the overlapping part between the second gate electrode 6 and the second impurity diffusion layer 11 (12) can be freely designed as compared with the method for forming the impurity diffusion layer using the gate electrode 6 as a mask.

According to a layout constitution example shown in FIG. 8, the first gate electrode 7, the second gate electrode 6 and the third gate electrode 27 are integrally formed of the same material and furthermore, a dimension L1 of the first gate electrode 7 in the opposed direction of the first impurity diffusion layers 9 and 10 is set to be the same as a dimension L2 of the gate electrode integrally comprising the second gate electrode 6 and the third gate electrode 27 (collectively referred to and the "second gate electrode 6" containing the integrally formed third gate electrode 27 in the description with reference to FIG. 8, hereinafter) in the opposed direction of the second impurity diffusion layers 11 and 12. In addition, FIG. 8A is a top view showing a schematic layout, FIG. 8B is a sectional schematic view taken along a line X1-X1' in FIG. 8A, and FIG. 8C is a sectional schematic view taken along a line X2-X2' in FIG. 8A.

According to the process for forming the general MOS transistor, the dimension L1 of the first gate electrode 7 (a gate length of the first gate electrode 7) in the opposed direction of the first impurity diffusion layers 9 and 10 is set to be small as much as possible in order to improve an ON/OFF ratio of the current. In addition, the variation in processing dimension of the gate electrode is in a certain degree regardless of the shape of the electrode. Therefore, according to the constitution example shown in FIG. 8, the degree of the variation of the dimension L2 of the second gate electrode 6 in the opposed direction of the second impurity diffusion layers 11 and 12 can be suppressed up to the degree of the variation of the dimension L1 of the first gate electrode 7. According to the above formulas (1) to (3), although the variation of the dimension L1 affects the overlapping area Arg between the first gate electrode 7, and the first impurity diffusion layers 9 and 10 and the first channel region 16, the variation of the dimension L2 affects the overlapping region area Acgp between the second gate electrode 6 and the second impurity diffusion layers 11 and 12, and the overlapping region area Acgn between the second gate electrode 6 and the second channel region 17, when the constitution shown in FIG. 8 is employed, the degrees of the variations of the L1 and L2 are suppressed to be about the same level, the variation in potential of the floating gate electrode FG can be suppressed.

In addition, as shown in FIGS. 8B and 8C, according to this constitution example, not only the gate electrode, but also the gate insulation films are integrally formed of the same material. That is, the first gate insulation film 5, the second gate insulation film 4, and the third gate insulation film 26 are formed by depositing a silicon oxide film, for example in the same process at the same time.

According to a layout constitution example shown in FIG. 9, the first gate electrode 7, the second gate electrode 6 and the third gate electrode 27 are integrally formed of the same material and furthermore, the second impurity diffusion layer 11 (12) and the high-concentration impurity diffusion layer 13 are opposed across the second gate electrode 6 (containing the third gate electrode 27) on the third impurity diffusion layer 3. That is, according to this constitution example, the element separating insulation film is not formed between the second impurity diffusion layer 11 (12) and the high-concentration impurity diffusion layer 13. In addition, FIG. 9A is a top view showing a schematic layout, and FIG. 9B is a schematic sectional view taken along a line Y1-Y1' in FIG. 9A.

In this constitution, the area of the region of the third impurity diffusion layer 3 can be reduced as compared with the constitution examples shown in FIGS. 7 and 8, so that the area of the whole memory cell 1 can be miniaturized.

Figure 10:
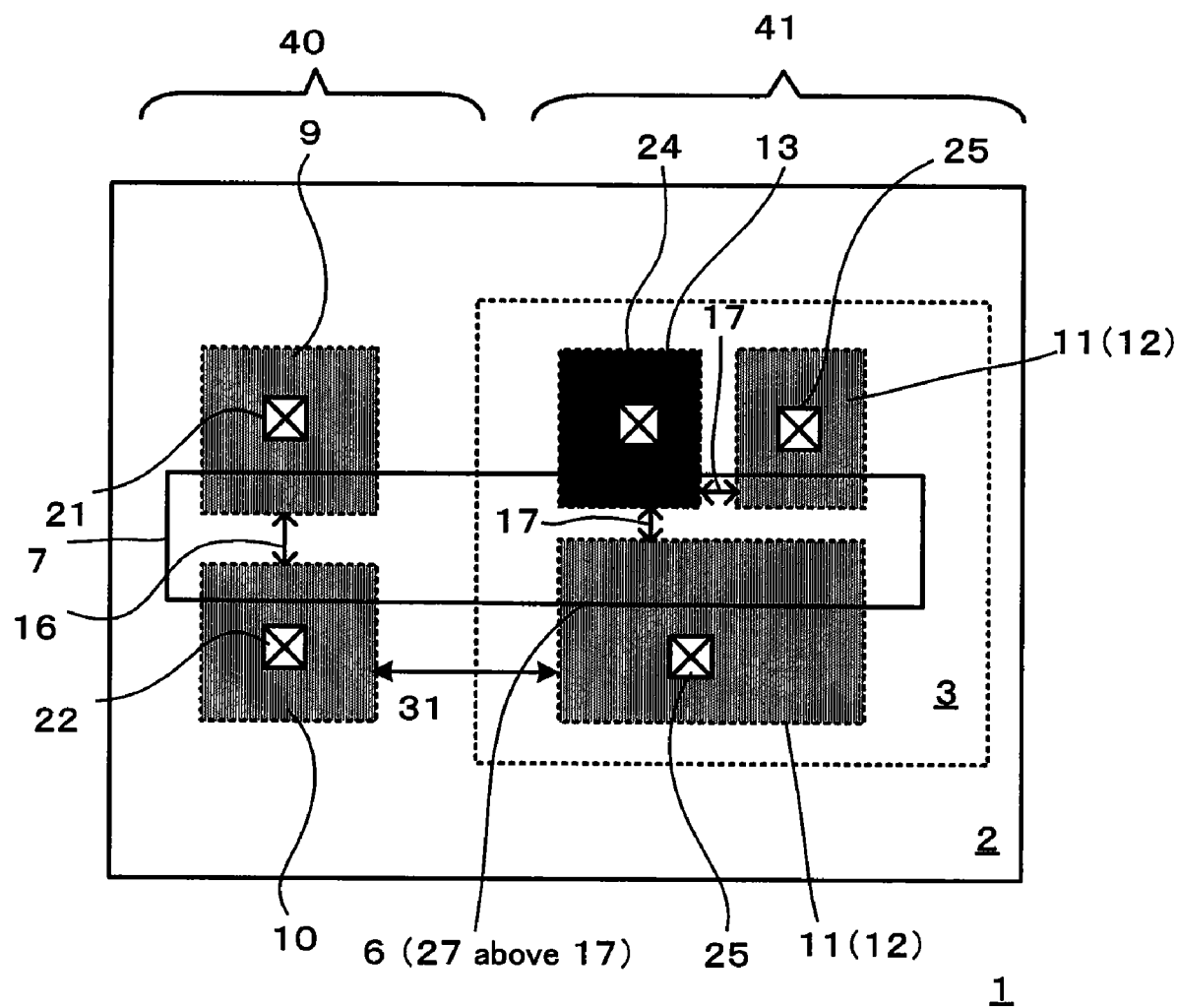
FIG. 10 is another example of a schematic view of the layout constitution in which the memory cell 1 of the present invention can be mounted.
Figure 11:
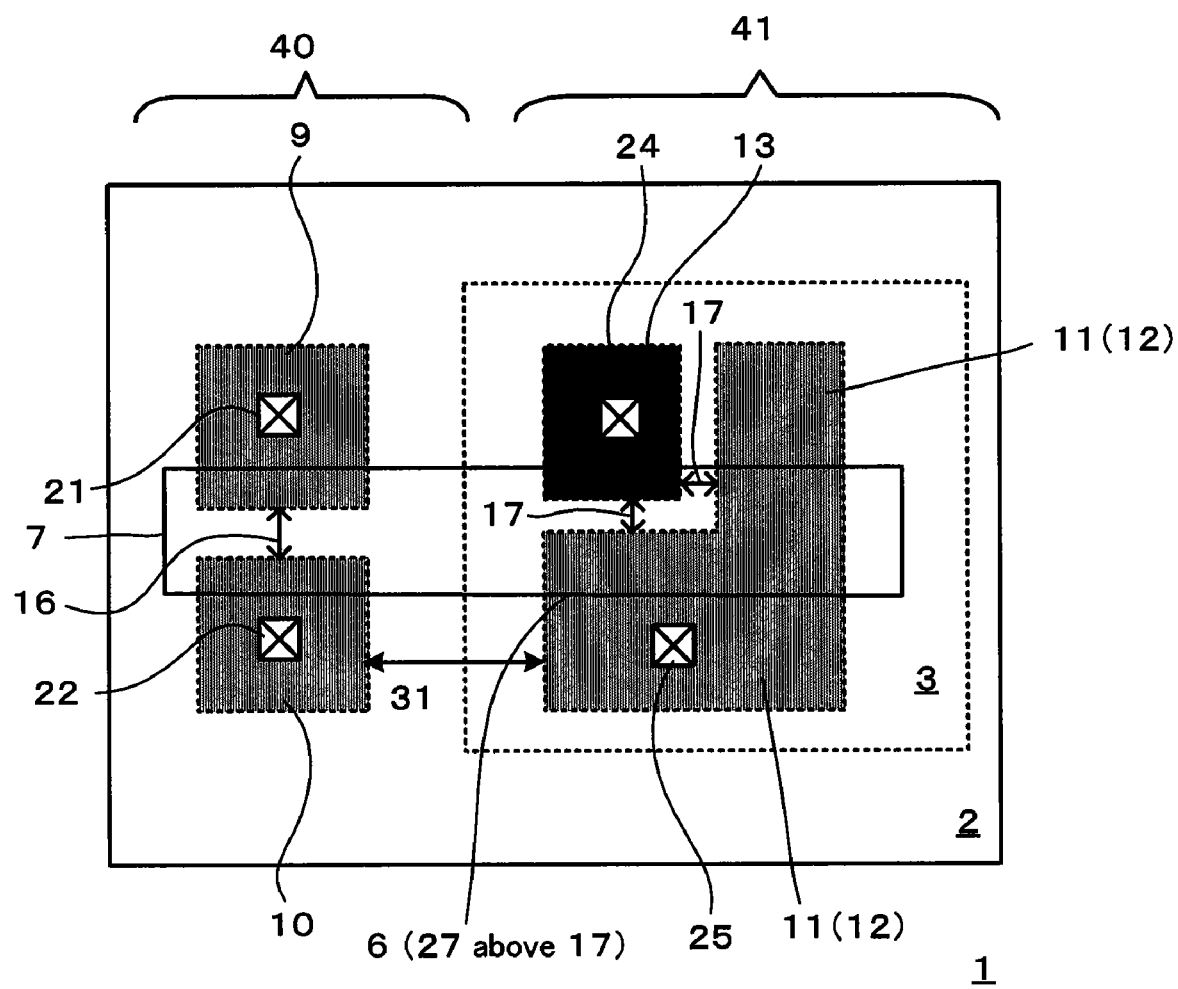
FIG. 11 is another example of a schematic view of the layout constitution in which the memory cell 1 of the present invention can be mounted.

In addition, as shown in FIG. 10, as another embodiment similar to the embodiment shown in FIG. 9, the high-concentration impurity diffusion layer 13 and the second impurity diffusion layer 11 (12) may be separately formed in the extending direction of the gate electrode on the third impurity diffusion layer 3. Furthermore, although the second impurity diffusion layer 11 (12) formed opposed to the high-concentration impurity diffusion layer 13 across the gate electrode and the second impurity diffusion layer 11 (12) separately formed in the extending direction of the gate electrode seem to be separately formed in FIG. 10, they may be integrally formed to provide a structure having a L-shaped (inversed L-shaped) second impurity diffusion layer 11 (12) (refer to FIG. 11).

In addition, according to the layout constitutions shown in FIGS. 7 to 11, the second impurity diffusion layer 11 (12) may be adjacent to a drain impurity diffusion layer of a high withstand voltage MOS transistor arranged at a part of the peripheral logic circuit region other than the region in which the memory cell of the present invention is formed, and formed at the same time as the impurity diffusion layer having the same conductivity type as the drain impurity diffusion layer and arranged so as to extend at least from the end of the drain impurity diffusion layer to a part of the region under the second gate electrode 6 (or the third gate electrode 27).

In general, a high withstand voltage COMS transistor provided in a standard logic CMOS transistor process has an impurity diffusion layer that is adjacent to the drain impurity diffusion layer of the high withstand voltage MOS transistor and has the same conductivity type as the drain impurity diffusion layer and arranged at least from the end of the drain impurity diffusion layer to a part of the region under the gate electrode of the high withstand voltage MOS transistor. The impurity diffusion layer has a density lower than that of the drain impurity diffusion layer of the standard logic CMOS transistor and it is arranged so as to have sufficient overlapping area with the gate electrode. Therefore, in this constitution, when a part of the manufacturing process of the high withstand voltage MOS transistor arranged at a part of the peripheral logic circuit region, that is, an impurity introducing step for forming the above low-density impurity diffusion layer is applied to the second impurity diffusion layer 11 in the memory cell of the present invention as it is, the second impurity diffusion layer 11 having sufficient overlapping area with the second gate electrode 6 can be formed without adding a new process to the manufacturing process of the high withstand voltage MOS transistor in the peripheral logic circuit.

Another Embodiment

Another embodiment will be described hereinafter.

(1) Although the source diffusion regions of the MOS transistors are connected to the same source line in the memory cells in the same row in FIG. 1, the source diffusion regions of the MOS transistors in the memory cells in the same column may be connected to the same source line. Furthermore, all the source diffusion regions of the MOS transistors in memory cells may be connected to the same source lines. In this case, at the time of erasing action, all the source lines are set to the floating state.

(2) Although the description has been made of the case where the erasing method is performed by the band-to-band tunneling induced hot hole injection, when some means, characteristics and effect of the above-described present invention are omitted and applied, the information may be erased by withdrawing the electrons accumulated in the floating gate electrode FG using FN tunneling, as can be understood by the person skilled in the art. That is, in the memory cell 1 shown in FIG. 2, a predetermined negative voltage is applied to the second impurity diffusion layers 11 and 12 from the contact 25, and a predetermined positive voltage is applied to the first impurity diffusion layer 9 from the contact 21, to generate a high electric field between the floating gate electrode FG and the first impurity diffusion layer 9 to withdraw the electrons accumulated in the floating gate electrode FG to the first impurity diffusion layer 9 by the FN tunneling phenomenon, whereby the erasing action is performed. In addition, when the FN tunneling is used, since it is necessary to generate the high electric field between the floating gate electrode FG an the first impurity diffusion layer 9, it is necessary to thin the first gate insulation film 5 when the action voltage is the same, or when the thickness of the gate insulation film 5 is the same, it is necessary to apply a high voltage to each diffusion layer (a high positive voltage to the first impurity diffusion layer 9 and a high negative voltage to the second impurity diffusion layers 11 and 12) so as not to exceed the withstand voltage of the first impurity diffusion layer 9 and the second impurity diffusion layer 11 or 12.

Figure 12:
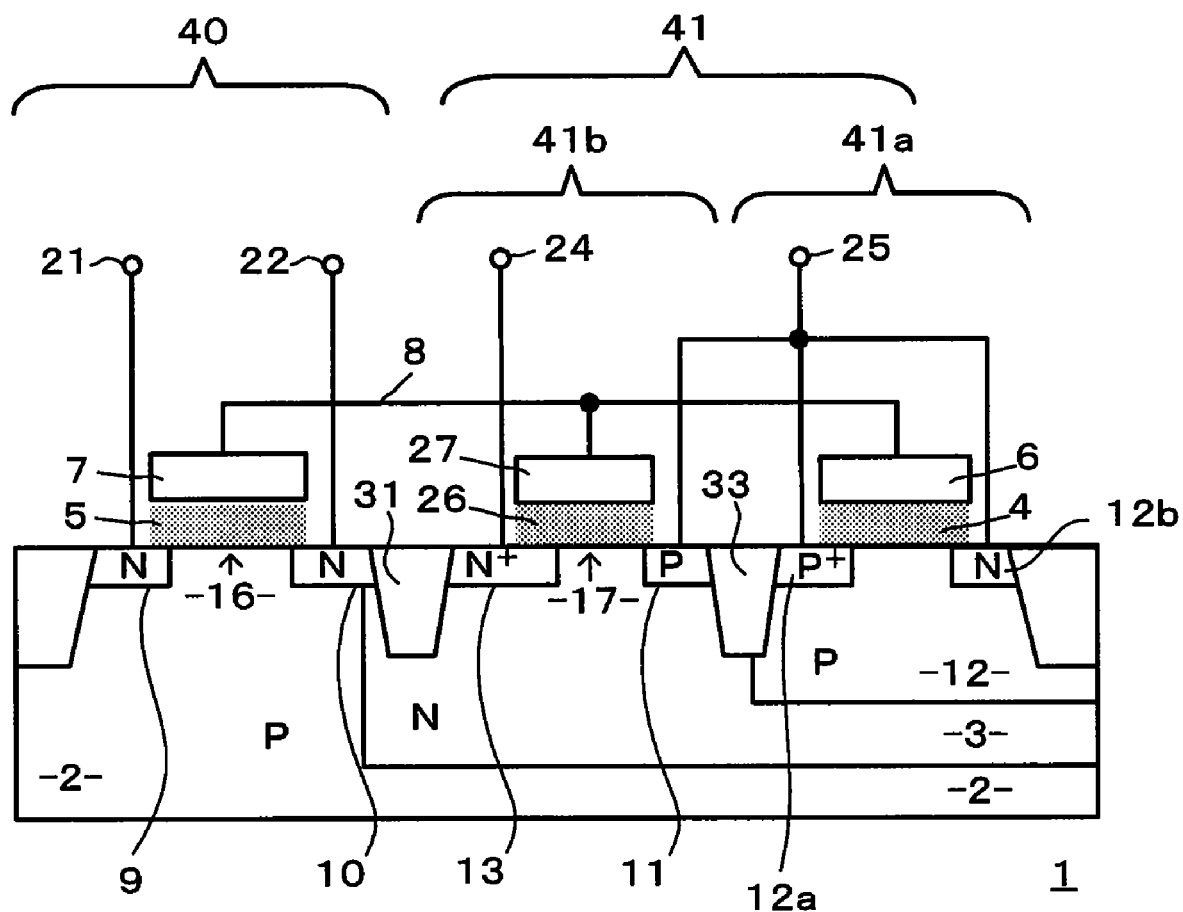
FIG. 12 is a schematic sectional structure view showing another memory cell of the present invention.

(3) The sectional constitution of the memory cell 1 shown in FIG. 1 may be as shown in FIG. 12 instead of the one shown in FIG. 2. FIG. 12 is a schematic sectional view showing another constitution example of the memory cell of the present invention.

According to the sectional view of a memory cell 1a of the present invention shown in FIG. 12, the first capacitor 41a in which the second impurity diffusion layer 12 and the second gate electrode 6 are formed through the second gate insulation film 4, and the second capacitor 41b in which the third impurity diffusion layer 3 and the third gate electrode 27 are formed through the third gate insulation film 26 are adjacent to each other through an element separating insulation film 33. Thus, the impurity diffusion region 11 having the same first conductivity type as the second impurity diffusion layer 12 is formed on the third impurity diffusion layer 3 and the third impurity diffusion layer 3 (electrically connected to the second control gate electrode 24) and the impurity diffusion layer 11 are in contact with each other to form the junction in the region under the third gate electrode 27 and the third gate insulation film 26 (second channel region 17).

Here, the impurity diffusion layer 11 having the same first conductivity type as the second impurity diffusion layer 12 is arranged to inject a minority carrier to an inversion layer when the surface of the second impurity diffusion layer 12 becomes an inversion condition under the third gate electrode 27, and connected to the first control gate electrode CG1 (contact 25). In addition, the impurity diffusion layer 11 is so constituted that its overlapping area with the third gate electrode 27 is small enough so as not to contribute to the capacitive coupling with the floating gate electrode FG.

In addition, an impurity diffusion layer 12b having the same second conductivity type as the third impurity diffusion layer 3 is provided to inject a minority carrier to the inversion layer when the surface of the second impurity diffusion layer 12 becomes the inversion condition under the second gate electrode 6, and connected to the first control gate electrode CG1 (contact 25). In addition, the impurity diffusion layer 12b is so constituted that its overlapping area with the second gate electrode 6 is small enough so as not to contribute to the capacitive coupling with floating gate electrode FG.

In addition, an impurity diffusion layer 12*a* having the same first conductivity type as the second impurity diffusion layer 12 is a high-concentration impurity diffusion layer arranged to provide electric contact between the contact 25 (first control gate electrode CG1) and the second impurity diffusion layer 12.

According to the constitution shown in FIG. 12, since the area of the first capacitor 41*a* (overlapping area between the second gate electrode 6 and the second impurity diffusion layer 12) can be large, the erasing ability can be further improved.

In addition, the impurity diffusion layer 12*b* may be connected to the capacitor 24 (second control gate electrode CG2) instead of being connected to the contact 25 (first control gate electrode CG1).

(4) Although the description has been made of the case where the N-type well 3 is formed on the P-type semiconductor substrate 2 in the above embodiment, the same effect can be provided in the case where a P-type well is formed on an N-type semiconductor substrate by reversing the conductivity type of each impurity diffusion layer and the polarity of the applied voltage.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A memory cell comprising:
a semiconductor substrate having a first conductivity type;
two first impurity diffusion layers separately formed on the semiconductor substrate and having a second conductivity type different from the first conductivity type;
a first gate electrode formed above a region containing at least a region sandwiched by the two first impurity diffusion layers through a first gate insulation film;
a second impurity diffusion layer having the first conductivity type and formed above the semiconductor substrate so as to be separated from the semiconductor substrate by an impurity diffusion layer having the second conductivity type;
a third impurity diffusion layer having the second conductivity type and formed on the semiconductor substrate;
a second gate electrode formed above a region containing at least the second impurity diffusion layer through a second gate insulation film;
a third gate electrode formed above a region containing at least the third impurity diffusion layer through a third gate insulation film;
a MOS transistor comprising the semiconductor substrate, the first impurity diffusion layer, the first gate insulation film, and the first gate electrode;
a first capacitor comprising the second impurity diffusion layer, the second gate insulation film, and the second gate electrode;
a second capacitor comprising the third impurity diffusion layer, the third gate insulation film, and the third gate electrode; and
a nonvolatile memory transistor in which one of the two first impurity diffusion layers is a source diffusion region, the other of the two first impurity diffusion layers is a drain diffusion region, the first gate electrode, the second gate electrode, and the third gate electrode are electrically connected to constitute a floating gate electrode, the second impurity diffusion layer constituting one electrode of the first capacitor is a first control gate electrode, and the third impurity diffusion layer constituting one electrode of the second capacitor is a second control gate electrode, wherein
a different voltage can be applied to each of the first control gate electrode and the second gate electrode.

2. The memory cell according to claim 1, wherein
a part of a junction between the second impurity diffusion layer and the third impurity diffusion layer is in contact with the second gate insulation film positioned under the second gate electrode, or the third gate insulation film positioned under the third gate electrode.

3. The memory cell according to claim 1, wherein
an area of the first capacitor is equal to or more than an area of the second capacitor.

4. The memory cell according claim 1, wherein
the first gate electrode, the second gate electrode, and the third gate electrode are integrally formed of the same conductivity material.

5. The memory cell according to claim 1, wherein
the first gate insulation film, the second gate insulation film, and the third gate insulation film are formed of the same material in the same process.

6. The memory cell according to claim 5, wherein
film thicknesses of the first gate insulation film, the second gate insulation film, and the third gate insulation film are thicker than the thinnest insulation film among a plurality of gate insulation films manufactured in a manufacturing process of a semiconductor chip comprising the nonvolatile memory transistor.

7. The memory cell according to claim 1, wherein
the third impurity diffusion layer is the second conductivity type of well formed on the semiconductor substrate, and the second impurity diffusion layer is the first conductivity type of impurity diffusion layer formed in the well.

8. The memory cell according to claim 1, wherein
in a high withstand voltage MOS transistor arranged at a part of a peripheral logic circuit region other than a region of the nonvolatile memory transistor, the second impurity diffusion layer is formed together with an impurity diffusion layer, the impurity diffusion layer being adjacent to a drain diffusion region of the high withstand voltage MOS transistor, extending at least from an end of the drain diffusion region to a part of a region under the gate electrode of the high withstand MOS transistor, and having the same conductivity type as that of the drain diffusion region.

9. The memory cell according to claim 1, wherein
at least one part of the second impurity diffusion layer is defined as an injection region by a photoresist with lithography, separately from a region of the second gate electrode.

10. The memory cell according to claim 1, wherein
when the two second impurity diffusion layers are separately formed in the well, a dimension of the first gate electrode in an opposed direction of the two first impurity diffusion layers is equal to the sum of dimensions of the second gate electrode and the third gate electrode in an opposed direction of the two second impurity diffusion layers.

11. The memory cell according to claim 1, wherein
the first conductivity type is a P-type and the second conductivity type is an N-type.

12. An erasing method of information recorded in the memory cell, the memory cell according to claim 1, the erasing method comprising:

applying a first erasing voltage to the first impurity diffusion layer, the first erasing voltage having a polarity constituting a reverse junction with the semiconductor substrate;

applying a second erasing voltage to the first control gate electrode, the second erasing voltage having a polarity different from that of the first erasing voltage; and applying a third erasing voltage corresponding to a ground voltage to the second control gate electrode.

13. An erasing method of information recorded in the memory cell, the memory cell according to claim 1, the erasing method comprising:

applying a first erasing voltage to the first impurity diffusion layer, the first erasing voltage having a polarity constituting a reverse junction with the semiconductor substrate;

applying a second erasing voltage to the first control gate electrode, the second erasing voltage having a polarity different from that of the first erasing voltage; and applying a third erasing voltage to the second control gate electrode, the third erasing voltage having the same polarity as that of the first erasing voltage.

14. The erasing method according to claim 12, wherein conductivity of the first impurity diffusion layer is an N-type, the first erasing voltage has a positive polarity, and the second erasing voltage has a negative polarity.

15. The erasing method according to claim 13, wherein conductivity of the first impurity diffusion layer is an N-type, the first erasing voltage has a positive polarity, the second erasing voltage has a negative polarity, and the third erasing voltage has a positive polarity.

16. The erasing method according to claim 13, wherein the third erasing voltage is set so that a potential of the third impurity diffusion layer is almost equal to that of a power supply voltage of a peripheral logic circuit.

17. A nonvolatile semiconductor memory device comprising:

a memory cell array provided by arranging memory cells according to claim 1 in each of a row direction and a column direction;

a plurality of first word lines to each of which the first control gate electrodes of the memory cells in the same row are commonly connected and a plurality of second word lines to each of which the second control gate electrodes of the memory cells in the same row are commonly connected;

a plurality of bit lines to each of which the first impurity diffusion layers of the memory cells in the same column are commonly connected;

a plurality of source lines to each of which the second impurity diffusion layers of the memory cells in the same column or the same row are commonly connected; and a voltage controlling means for controlling a voltage applied to each of the plurality of first word lines, the plurality of second word lines, the plurality of bit lines, and the plurality of the source lines.

\* \* \* \* \*